US012635456B2

(12) United States Patent
Suizu et al.

(10) Patent No.: US 12,635,456 B2
(45) Date of Patent: May 19, 2026

(54) METHOD OF DISPLAYING SUBSTRATE ARRANGEMENT DATA, METHOD OF MANUFACTURING SEMICONDUCTOR DEVICE, NON-TRANSITORY COMPUTER-READABLE RECORDING MEDIUM AND SUBSTRATE PROCESSING APPARATUS

(71) Applicant: Kokusai Electric Corporation, Tokyo (JP)

(72) Inventors: Yuna Suizu, Toyama (JP); Hajime Abiko, Toyama (JP); Susumu Nishiura, Toyama (JP); Mitsuru Funakura, Toyama (JP); Takuya Kato, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 517 days.

(21) Appl. No.: 18/190,431

(22) Filed: Mar. 27, 2023

(65) Prior Publication Data

US 2023/0238263 A1     Jul. 27, 2023

Related U.S. Application Data

(63) Continuation of application No. PCT/JP2021/029418, filed on Aug. 6, 2021.

(30) Foreign Application Priority Data

Sep. 25, 2020     (JP) ................................ 2020-160829

(51) Int. Cl.
　　*H10P 72/00*　　　　(2026.01)
　　*C23C 16/455*　　　(2006.01)
　　　　　　(Continued)

(52) U.S. Cl.
　　CPC .... *H10P 72/0612* (2026.01); *C23C 16/45563* (2013.01); *C23C 16/46* (2013.01);
　　　　　　(Continued)

(58) Field of Classification Search
　　CPC ........ C23C 16/45546; C23C 16/45563; C23C 16/4583; C23C 16/46; G05B 19/4189;
　　　　　　(Continued)

(56) References Cited

U.S. PATENT DOCUMENTS 5,980,194 A * 11/1999 Freerks ................... H01L 21/68
　　　　　　　　　　　　　　　　　414/754
2015/0016936 A1* 1/2015 Shindo .............. H01L 21/67742
　　　　　　　　　　　　　　　　　414/749.5

(Continued)

FOREIGN PATENT DOCUMENTS

JP　　　　　6724120 B　　　7/2020

OTHER PUBLICATIONS

Extended European Search Report in European Application No. 21872014.2, dated Dec. 12, 2024, 9 pages.

*Primary Examiner* — Kidest Worku
(74) *Attorney, Agent, or Firm* — Edell, Shapiro & Finnan, LLC

(57) ABSTRACT

According to one aspect of the technique of the present disclosure, there is provided a method of displaying substrate arrangement data, including: (a) setting each of a transport parameter for determining at least an arrangement of substrates to be loaded into a substrate retainer and carrier information of a carrier storing the substrates to be loaded into the substrate retainer; (b) creating the substrate arrangement data of a case where the substrates are loaded into the substrate retainer based on the transport parameter and the carrier information set in (a); and (c) displaying the substrate arrangement data at least comprising data representing the (Continued)

arrangement of the substrates in a state where the substrates are loaded in the substrate retainer.

16 Claims, 13 Drawing Sheets

(51) Int. Cl.
| | | |
|---|---|---|
| *C23C 16/46* | (2006.01) | |
| *G05B 19/418* | (2006.01) | |
| *H10P 72/30* | (2026.01) | |
| *H10P 72/76* | (2026.01) | |

(52) U.S. Cl.
CPC ...... *G05B 19/4189* (2013.01); *H10P 72/3412* (2026.01); *H10P 72/7602* (2026.01); *G05B 2219/37612* (2013.01)

(58) Field of Classification Search
CPC .... G05B 2219/37612; H01L 21/67242; H01L 21/67276; H01L 21/67757; H01L 21/67781; H01L 21/68707
See application file for complete search history.

(56) References Cited

U.S. PATENT DOCUMENTS

| | | | | |
|---|---|---|---|---|
| 2016/0172225 | A1* | 6/2016 | Morikawa ......... | H01L 21/67766 |
| | | | | 414/217.1 |
| 2018/0061692 | A1 | 3/2018 | Nishino et al. | |
| 2019/0189490 | A1* | 6/2019 | Morita ............. | H01L 21/67309 |

* cited by examiner

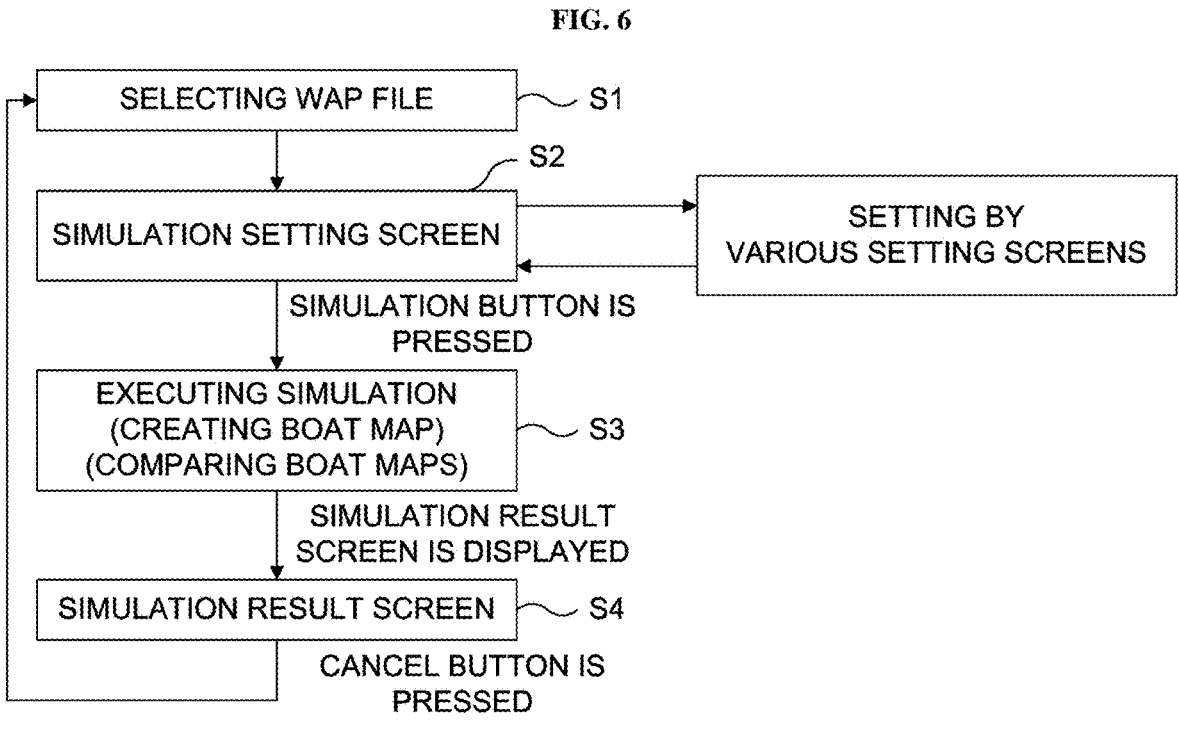

SELECTING WAP FILE — S1

S2

SIMULATION SETTING SCREEN → SETTING BY VARIOUS SETTING SCREENS

SIMULATION BUTTON IS PRESSED

EXECUTING SIMULATION
(CREATING BOAT MAP)
(COMPARING BOAT MAPS) — S3

SIMULATION RESULT SCREEN IS DISPLAYED

SIMULATION RESULT SCREEN — S4

CANCEL BUTTON IS PRESSED

FIG. 7

| PARAMETER | | DETAILS |
| --- | --- | --- |
| CONFIGURATION PARAMETER | | |
| FUNCTION PARAMETER | | |
| MAINTENANCE PARAMETER | | |
| TRANSPORT PARAMETER | | |

BUFFER SHELF     EDIT

MATERIAL          CHANGE

SIMULATION     CANCEL

FIG. 8

METHOD OF DISPLAYING SUBSTRATE ARRANGEMENT DATA, METHOD OF MANUFACTURING SEMICONDUCTOR DEVICE, NON-TRANSITORY COMPUTER-READABLE RECORDING MEDIUM AND SUBSTRATE PROCESSING APPARATUS

CROSS REFERENCE TO RELATED APPLICATIONS

This application is a bypass continuation application of PCT International Application No. PCT/JP2021/029418, filed on Aug. 6, 2021, in the WIPO, the international application being based upon and claiming the benefit of priority from Japanese Patent Application No. 2020-160829, filed on Sep. 25, 2020, in the Japanese Patent Office, the entire contents of which are hereby incorporated by reference.

TECHNICAL FIELD

The present disclosure relates to a method of displaying substrate arrangement data, a method of manufacturing a semiconductor device, a non-transitory computer-readable recording medium and a substrate processing apparatus.

BACKGROUND

In recent years, as a device such as a semiconductor device is miniaturized and a three-dimensional structure is used as a structure of the device, a substrate processing is diversified and types of transport conditions of the substrate processing are also increasing and becoming more complicated. Until now, according to some related arts, it may be possible to display and check a transport status of substrates. However, currently in practice, it is not possible to check the transport status before actually transferring the substrate. Therefore, it is preferable that an operating personnel fully understands the transport conditions and calculates the transport status in the same way as a controller.

However, it is difficult for the operating personnel to easily grasp the transport conditions. Thereby, there is a possibility that the transport status of the substrates may be unintentionally set by the operating personnel. In such a case, a production efficiency may be lowered due to a reason such as a stoppage of an apparatus when a shortage of the substrates occurs, and a quality of the substrate processing may deteriorate due to a reason such as variations in process conditions. As a result, a loss of the substrates may occur.

SUMMARY

According to the present disclosure, there is provided a technique capable of checking an arrangement of substrates loaded in a substrate retainer before the substrates are transported to the substrate retainer.

According to one aspect of the technique of the present disclosure, there is provided a method of displaying substrate arrangement data, including: (a) setting each of a transport parameter for determining at least an arrangement of substrates to be loaded into a substrate retainer and carrier information of a carrier storing the substrates to be loaded into the substrate retainer; (b) creating the substrate arrangement data of a case where the substrates are loaded in the substrate retainer based on the transport parameter and the carrier information set in (a); and (c) displaying the substrate arrangement data at least comprising data representing the arrangement of the substrates in a state where the substrates are loaded in the substrate retainer.

BRIEF DESCRIPTION OF THE DRAWINGS

FIG. 5A is a diagram schematically illustrating a transport flow during a conventional substrate processing.

FIG. 6 is a flow chart schematically illustrating a substrate arrangement program according to a first embodiment of the present disclosure.

FIG. 7 is a diagram schematically illustrating an example of a simulation setting screen.

FIG. 8 is a diagram schematically illustrating an example of simulation results according to the first embodiment of the present disclosure.

DETAILED DESCRIPTION

Figure 1:
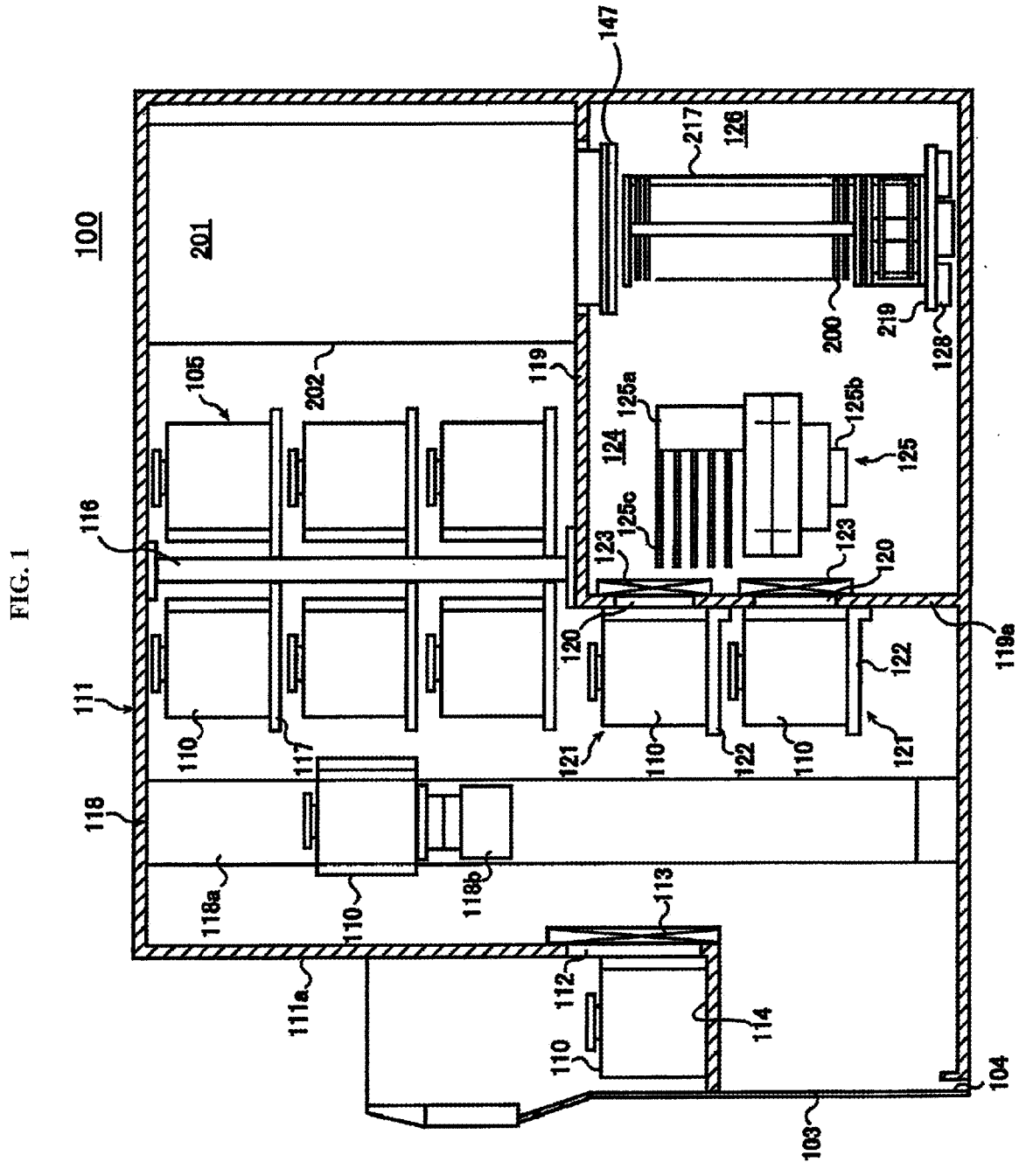
FIG. 1 is a diagram schematically illustrating a side perspective view of a substrate processing apparatus according to embodiments of the present disclosure.

Hereinafter, embodiments according to the technique of the present disclosure will be described with reference to the drawings. Like reference numerals represent like components in the drawings, and redundant descriptions related thereto will be omitted. Further, in the drawings, for the sake of convenience of the descriptions, features such as width, thickness and shape of each component may be schematically illustrated as compared with actual structures. However, the drawings are merely examples of the embodiments, and the embodiments according to the technique of the present disclosure are not limited thereto.

In the present embodiments of the present disclosure, for example, a substrate processing apparatus is configured as a semiconductor manufacturing apparatus capable of performing a substrate processing serving as a part of a manufacturing process in a method of manufacturing a semiconductor device (for example, an integrated circuit, abbreviated as "IC").

As shown in FIG. 1, a substrate processing apparatus 100 according to the present embodiments uses a pod 110 serving as a carrier for storing a plurality of wafers including a wafer (which is a substrate) 200 made of a material such as silicon, and includes a housing 111. Hereinafter, the plurality of wafers including the wafer 200 may also be simply referred to as "wafers 200". A pod loading/unloading port 112 is provided at a front wall 111a of the housing 111 so as to communicate with an inside and an outside of the housing 111. The pod loading/unloading port 112 is configured to be opened or closed by a front shutter 113. A loading port shelf 114 is provided in front of the pod loading/unloading port 112, and the pod 110 is placed on the loading port shelf 114. The pod 110 may be transferred (or loaded) into and placed on the loading port shelf 114 by an in-process transfer apparatus (not shown) and transferred (or unloaded) out of the loading port shelf 114 by the in-process transfer apparatus.

A storage shelf 105 serving as buffer shelves is provided in the housing 111 to be located over a substantially center portion of the housing 111 in a front-rear direction. The storage shelf 105 rotates around a vertical column 116, and is configured such that a plurality of pods including the pod 110 can be stored (or placed) on a plurality of shelf plates 117. Hereinafter, the plurality of pods including the pod 110 may also be simply referred to as "pods 110". As shown in FIG. 1, a pod transfer device 118 is provided between the loading port shelf 114 and the storage shelf 105 in the housing 111. The pod transfer device 118 is constituted by a pod elevator 118a capable of elevating and lowering the pod 110 while supporting the pod 110 and a pod transfer structure 118b serving as a horizontal transfer structure. The pod transfer device 118 is configured to transfer the pod 110 among the loading port shelf 114, the storage shelf 105 and a pod opener 121 described later.

As shown in FIG. 1, a sub-housing 119 is provided in housing 111 at a lower portion thereof and at a substantially center portion of the housing 111 in the front-rear direction to extend toward a rear end of the substrate processing apparatus 100. A pair of wafer loading/unloading ports 120 through which the wafer 200 is transferred (or loaded) into or transferred (or unloaded) out of the sub-housing 119 are provided at a front wall 119a of the sub-housing 119. The pair of wafer loading/unloading ports 120 are arranged vertically in two stages. A pair of pod openers including the pod opener 121 are provided at the pair of wafer loading/unloading ports 120, respectively. For example, an upper pod opener and a lower pod opener may be provided as the pair of pod openers. The upper pod opener and the lower pod opener may be collectively or individually referred to as the "pod opener 121".

The pod opener 121 may include: a placement table 122 where the pod 110 is placed thereon; and a cap attaching/detaching structure 123 capable of opening and closing a cap (which is a lid) of the pod 110. The pod opener 121 is configured such that a wafer entrance of the pod 110 is opened or closed by opening or closing the cap of the pod 110 placed on the placement table 122 by the cap attaching/detaching structure 123. The placement table 122 serves as a transport shelf on which the pod 110 is placed when the wafer 200 is transported.

As shown in FIG. 1, the sub-housing 119 constitutes a transfer chamber 124 isolated from an atmosphere of an installation space in which the pod transfer device 118 or the storage shelf 105 is provided. A wafer transport structure 125 serving as a substrate transport structure is provided at a front region of the transfer chamber 124.

The wafer transport structure 125 is constituted by: a wafer transport device 125a capable of rotating or moving the wafer 200 in a horizontal direction while supporting the wafer 200 by tweezers 125c; and a wafer transport device elevator 125b capable of elevating and lowering the wafer transport device 125a. The wafer transport structure 125 may load (or charge) or unload (or discharge) the wafer 200 into or out of a boat 217 by consecutive operations of the wafer transport device elevator 125b and the wafer transport device 125a. As shown in FIG. 1, for example, the tweezers 125c according to the present embodiments includes five mounting portions, and the wafer transport structure 125 is configured to be capable of transferring five wafers 200 at once or one by one.

As shown in FIG. 1, a process furnace 202 is provided above the boat 217. A process chamber 201 (see FIG. 2) is provided in the process furnace 202, and a heater 207 (see FIG. 2) capable of heating the process chamber 201 is provided around the process chamber 201. A lower end of the process furnace 202 is opened and closed by a furnace opening gate valve 147.

As shown in FIG. 1, a seal cap 219 is provided below the boat 217 in a horizontal orientation. The seal cap 219 supports the boat 217 in a vertical direction, and is configured to be capable of closing the lower end of the process furnace 202.

Figure 2:
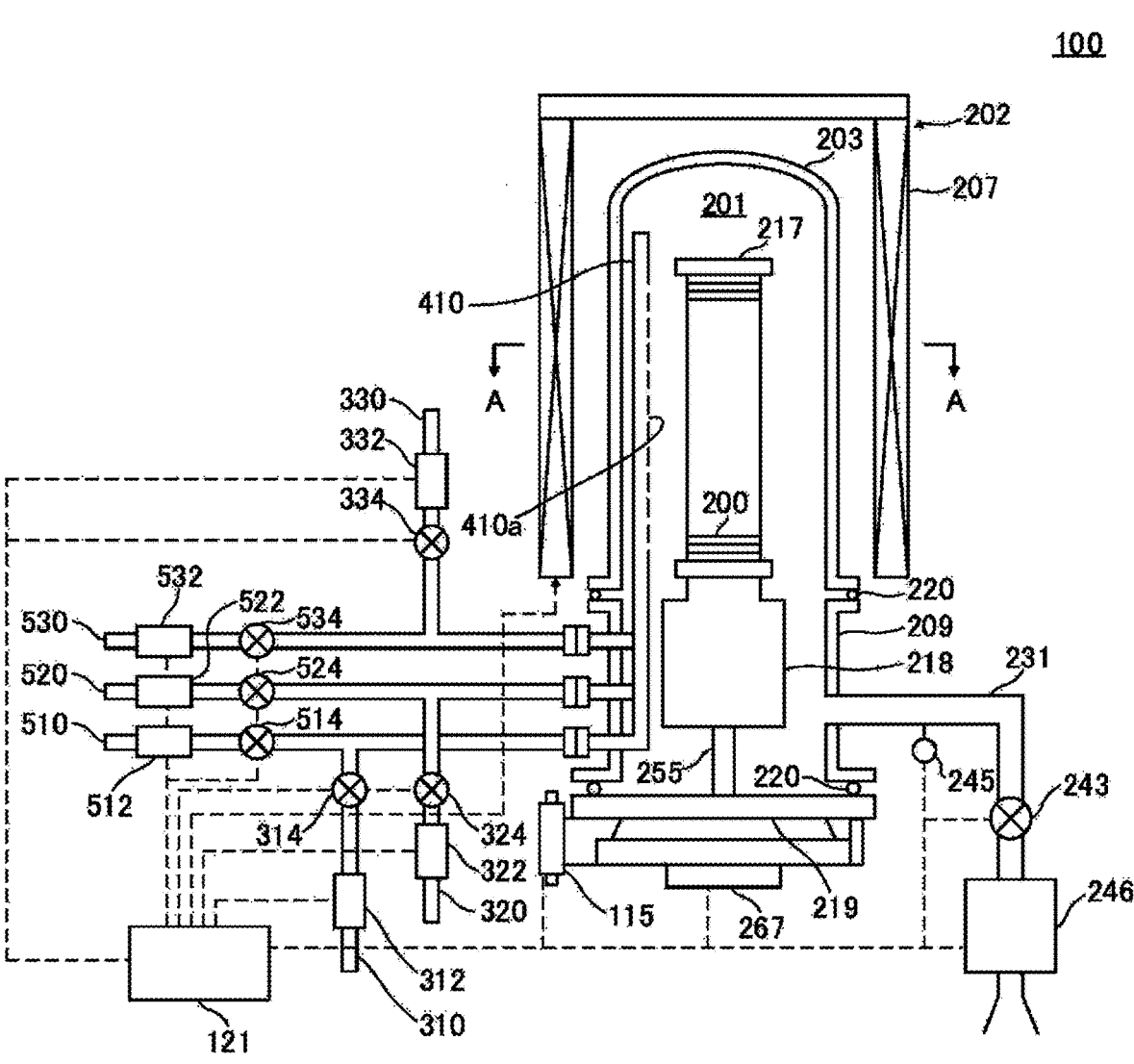
FIG. 2 is a diagram schematically illustrating a plan view of a process furnace of the substrate processing apparatus according to the embodiments of the present disclosure.

Subsequently, operations of the substrate processing apparatus 100 according to the present embodiments will be described. As shown in FIGS. 1 and 2, when the pod 110 is placed on the loading port shelf 114, the pod loading/unloading port 112 is opened by the front shutter 113. Then, the pod 110 is transferred (or loaded) into the housing 111 through the pod loading/unloading port 112. The pod 110 transferred into the housing 111 is automatically transferred and stored in a designated shelf plate among the shelf plates 117 of the storage shelf 105 by the pod transfer device 118.

The pod 110 may be transferred toward one of the upper and lower pod openers 121 from the designated shelf plate among the shelf plates 117 and transported to (or placed on) the placement table 122 after temporarily stored in the storage shelf 105, or may be directly transferred from the loading port shelf 114 toward the one of the upper and lower pod openers 121 and transported to (or placed on) the placement table 122. When transferring the pod 110, the wafer loading/unloading ports 120 of the upper and lower pod openers 121 are closed by the cap attaching/detaching structure 123, and clean air is circulated through the transfer chamber 124 until the transfer chamber 124 is filled with clean air.

As shown in FIG. 1, the cap attaching/detaching structure 123 detaches the cap from the pod 110 placed on the placement table 122, and the wafer entrance of the pod 110 is opened. Then, the wafer 200 is picked up by the wafer transport structure 125 from the pod 110, and transported and charged into the boat 217. After charging the wafer 200 into the boat 217, the wafer transport structure 125 returns to the pod 110 and transfers a next wafer among the wafers 200 from the pod 110 into the boat 217.

While the wafer transport device 125a (that is, the wafer transport structure 125) loads the wafer 200 from the one of the upper and lower pod openers 121 into the boat 217, another pod 110 is transferred by the pod transfer device 118 from the storage shelf 105 or the loading port shelf 114 to the other one of the upper and lower pod openers 121, and the cap of the aforementioned another pod 110 is opened by the cap attaching/detaching structure 123 of the pod opener 121.

When a predetermined number of wafers including the wafer 200 are charged into the boat 217, the lower end of the process furnace 202 is opened by the furnace opening gate valve 147. Subsequently, the seal cap 219 is elevated by a boat elevator 115 described later, and the boat 217 supported by the seal cap 219 is loaded into the process chamber 201 in the process furnace 202 (boat loading step). After the boat 217 is loaded into the process chamber 201, the wafers 200 are processed as intended in the process chamber 201 (substrate processing). After the wafers 200 are processed, the boat 217 is unloaded from the process chamber 201 by the boat elevator 115 (boat unloading step). Then, the wafers 200 and the pod 110 are unloaded out of the housing 111 in an order substantially reverse to that described above.

Configuration of Process Furnace

Figure 3:
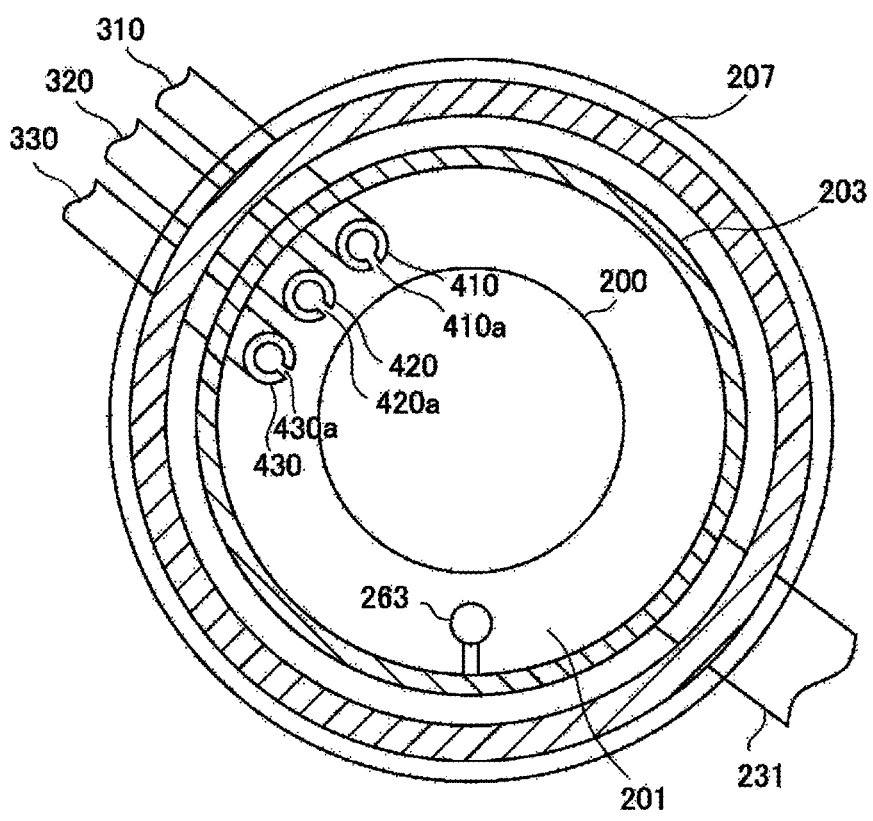
FIG. 3 is a diagram schematically illustrating a vertical cross-section taken along a line A-A of FIG. 2.

As shown in FIGS. 2 and 3, the heater 207 serving as a heating structure capable of heating the wafer (substrate) 200 is provided at the process furnace 202. A reaction tube 203 constituting a reaction vessel (or a process vessel) is provided on an inner side of the heater 207 to be aligned in a manner concentric with the heater 207. For example, the reaction tube 203 is made of a heat resistant material such as quartz (SiO2). The reaction tube 203 is of a cylindrical shape with a closed upper end and an open lower end.

A manifold 209 made of a material such as a stainless steel is provided at the lower end of the reaction tube 203. The manifold 209 is of a cylindrical shape, and a lower end opening of the manifold 209 is airtightly closed (or sealed) by the seal cap 219 serving as a lid. O-rings 220 are provided between the reaction tube 203 and the manifold 209 and between the manifold 209 and the seal cap 219, respectively. The process chamber 201 is defined by the reaction tube 203, the manifold 209 and the seal cap 219. The boat 217 serving as a substrate retainer is installed vertically on the seal cap 219 via a boat support base 218.

The wafers 200 to be batch-processed are vertically stacked in the boat 217 in a multistage manner in a horizontal orientation. The boat 217 is configured to be capable of being elevated and lowered with respect to the reaction tube 203 by the boat elevator 115. A boat rotator 267 capable of rotating the boat 217 in order to improve a uniformity of a processing (that is, the substrate processing described above) is provided below the boat support base 218. The heater 207 is capable of heating the wafers 200 inserted into the process chamber 201 to a predetermined temperature.

A nozzle 410 (which is a first nozzle 410), a nozzle 420 (which is a second nozzle 420) and a nozzle 430 (which is a third nozzle 430) are provided in the process chamber 201 so as to penetrate a lower portion of the reaction tube 203. A gas supply pipe 310 (which is a first gas supply pipe 310), a gas supply pipe 320 (which is a second gas supply pipe 320) and a gas supply pipe 330 (which is a third gas supply pipe 330) are connected to the nozzle 410, the nozzle 420 and the nozzle 430, respectively, wherein the gas supply pipe 310, the gas supply pipe 320 and the gas supply pipe 330 serve as a gas supply line. That is, for example, three nozzles 410, 420 and 430 and three gas supply pipes 310, 320 and 330 are provided at the reaction tube 203 such that a plurality of types of gases (three types of gases (process gases) according to the present embodiments) are capable of being supplied into the process chamber 201.

A mass flow controller (abbreviated as "MFC") 312 serving as a flow rate controller (flow rate control structure) and a valve 314 serving as an opening/closing valve are sequentially installed at the gas supply pipe 310 in this order from an upstream side to a downstream side of the gas supply pipe 310 in a gas flow direction. The nozzle 410 is connected to a front end (tip) of the gas supply pipe 310. The nozzle 410 is configured as a long nozzle, and a horizontal portion of the nozzle 410 is provided so as to pass through a side wall of the manifold 209. A vertical portion of the nozzle 410 is installed in an arc-shaped space provided between an inner wall of the reaction tube 203 and the wafers 200, and extends upward from the lower portion toward an upper portion of the reaction tube 203 along the inner wall of the reaction tube 203 (that is, extends upward along a stacking direction of the wafers 200). That is, the vertical portion of the nozzle 410 is installed so as to extend from one end toward the other end of a wafer arrangement region in which the wafers 200 are arranged. That is, the nozzle 410 is installed in a region (which is located beside and horizontally surrounds the wafer arrangement region) to extend along the wafer arrangement region.

A plurality of gas supply holes 410a through which a gas such as a first source gas is supplied are provided at a side surface of the nozzle 410. The gas supply holes 410a are open toward a center of the reaction tube 203. The gas supply holes 410a are provided from the lower portion toward the upper portion of the reaction tube 203. An opening area of each of the gas supply holes 410a may be the same, or may be increased or decreased as it goes from the lower portion to the upper portion of the reaction tube 203, and each of the gas supply holes 410a is provided at the same pitch. A first gas supplier (which is a first gas supply structure or a first gas supply system) is constituted mainly by the gas supply pipe 310, the MFC 312, the valve 314 and the nozzle 410.

Further, a carrier gas supply pipe 510 through which a carrier gas is supplied is connected to the gas supply pipe 310. A first carrier gas supplier (which is a first carrier gas supply structure or a first carrier gas supply system) is constituted mainly by the carrier gas supply pipe 510, an MFC 512 and a valve 514.

An MFC 322 serving as a flow rate controller (flow rate control structure) and a valve 324 serving as an opening/closing valve are sequentially installed at the gas supply pipe 320 in this order from an upstream side to a downstream side of the gas supply pipe 320 in the gas flow direction. The nozzle 420 is connected to a front end (tip) of the gas supply pipe 320. Similar to the nozzle 410, the nozzle 420 is configured as a long nozzle. Configurations of a horizontal portion and a vertical portion of the nozzle 420 are substantially the same as those of the horizontal portion and the vertical portion of the nozzle 410.

A plurality of gas supply holes 420a through which a gas such as a second source gas is supplied are provided at a side surface of the nozzle 420. Configurations of the gas supply holes 420a are substantially the same as those of the gas supply holes 410a. A second gas supplier (which is a second gas supply structure or a second gas supply system) is constituted mainly by the gas supply pipe 320, the MFC 322, the valve 324 and the nozzle 420.

Further, a carrier gas supply pipe 520 through which the carrier gas is supplied is connected to the gas supply pipe 320. A second carrier gas supplier (which is a second carrier gas supply structure or a second carrier gas supply system) is constituted mainly by the carrier gas supply pipe 520, an MFC 522 and a valve 524.

An MFC 332 serving as a flow rate controller (flow rate control structure) and a valve 334 serving as an opening/closing valve are sequentially installed at the gas supply pipe 330 in this order from an upstream side to a downstream side of the gas supply pipe 330 in the gas flow direction. The nozzle 430 is connected to a front end (tip) of the gas supply pipe 330. Similar to the nozzle 410, the nozzle 430 is configured as a long nozzle. Configurations of a horizontal portion and a vertical portion of the nozzle 430 are substantially the same as those of the horizontal portion and the vertical portion of the nozzle 410 or the nozzle 420.

A plurality of gas supply holes 430a through which a gas such as a reactive gas is supplied are provided at a side surface of the nozzle 430. Configurations of the gas supply holes 430a are substantially the same as those of the gas supply holes 410a or the gas supply holes 420a. A third gas supplier (which is a third gas supply structure or a third gas supply system) is constituted mainly by the gas supply pipe 330, the MFC 332, the valve 334 and the nozzle 430.

Further, a carrier gas supply pipe 530 through which carrier gas is supplied is connected to the gas supply pipe 330. A third carrier gas supplier (which is a third carrier gas supply structure or a third carrier gas supply system) is constituted mainly by the carrier gas supply pipe 530, an MFC 532 and a valve 534.

According to the present embodiments, as described above, the gases such as the first source gas, the second source gas and the reactive gas are respectively supplied through the nozzles 410, 420 and 430, which are provided in the arc-shaped space (that is, a vertically elongated space), defined by the inner wall of the reaction tube 203 and the edges (peripheries) of the wafers 200 arranged in the reaction tube 203. Then, the gases are ejected into the reaction tube 203 in the vicinity of the wafers 200 respectively through the gas supply holes 410a, the gas supply holes 420a and the gas supply holes 430a. Each of the gases ejected into the reaction tube 203 mainly flows in a direction parallel to surfaces of the wafers 200, that is, in the horizontal direction. Thereby, it is possible to uniformly supply the gases to each of the wafers 200, and it is also possible to uniformize a thickness of a film formed on each of the wafers 200. Although each of the nozzles 410, 420 and 430 is described as a long nozzle whose horizontal portion and vertical portion are integrally provided as a single body, each of the nozzles 410, 420 and 430 may be configured as a nozzle implemented by assembling a horizontal portion thereof and a vertical portion thereof that are provided separately.

The first source gas is supplied into the process chamber 201 through the gas supply pipe 310 provided with the MFC 312 and the valve 314 and the nozzle 410. The second source gas is supplied into the process chamber 201 through the gas supply pipe 320 provided with the MFC 322 and the valve 324 and the nozzle 420. The reactive gas is supplied into the process chamber 201 through the gas supply pipe 330 provided with the MFC 332 and the valve 334 and the nozzle 430.

The carrier gas (inert gas) is supplied into the process chamber 201 through the carrier gas supply pipes 510, 520 and 530 provided with the MFCs 512, 522 and 532 and the valves 514, 524 and 534, respectively, and the nozzles 410, 420 and 430.

An exhaust pipe 231 through which an inner atmosphere of the process chamber 201 is exhausted is provided at the reaction tube 203. The exhaust pipe 231 is provided so as to penetrate the side wall of manifold 209 at a position facing the nozzles 410, 420 and 430. With such a configuration, each of the gases supplied in the vicinity of the wafers 200 in the process chamber 201 through the gas supply holes 410a, the gas supply holes 420a and the gas supply holes 430a flows in the horizontal direction (that is, in the direction parallel to the surfaces of the wafers 200). Thereafter, each of the gases flows downward, and is exhausted through the exhaust pipe 231.

A pressure sensor 245 serving as a pressure detector (pressure detection structure) capable of detecting an inner pressure of the process chamber 201, an APC (Automatic Pressure Controller) valve 243 and a vacuum pump 246 serving as a vacuum exhaust apparatus are sequentially installed at the exhaust pipe 231 in this order from an upstream side to a downstream side of the exhaust pipe 231 in the gas flow direction. The APC valve 243 is configured as an exhaust valve, and serves as a pressure regulator (pressure adjusting structure). An exhauster (which is an exhaust structure or an exhaust system) (that is, an exhaust line) is constituted mainly by the exhaust pipe 231, the APC valve 243 and the pressure sensor 245. The exhauster may further include the vacuum pump 246.

Further, with the vacuum pump 246 in operation, an opening degree of the APC valve 243 may be adjusted in order to control (or adjust) the inner pressure of the process chamber 201.

A temperature sensor 263 serving as a temperature detector is installed in the reaction tube 203. An amount of the current supplied (or applied) to the heater 207 is adjusted based on temperature information detected by the temperature sensor 263 such that a desired temperature distribution of an inner temperature of the process chamber 201 can be obtained. Similar to the nozzles 410, 420 and 430, the temperature sensor 263 is L-shaped, and is provided along the inner wall of the reaction tube 203.

Figure 4:
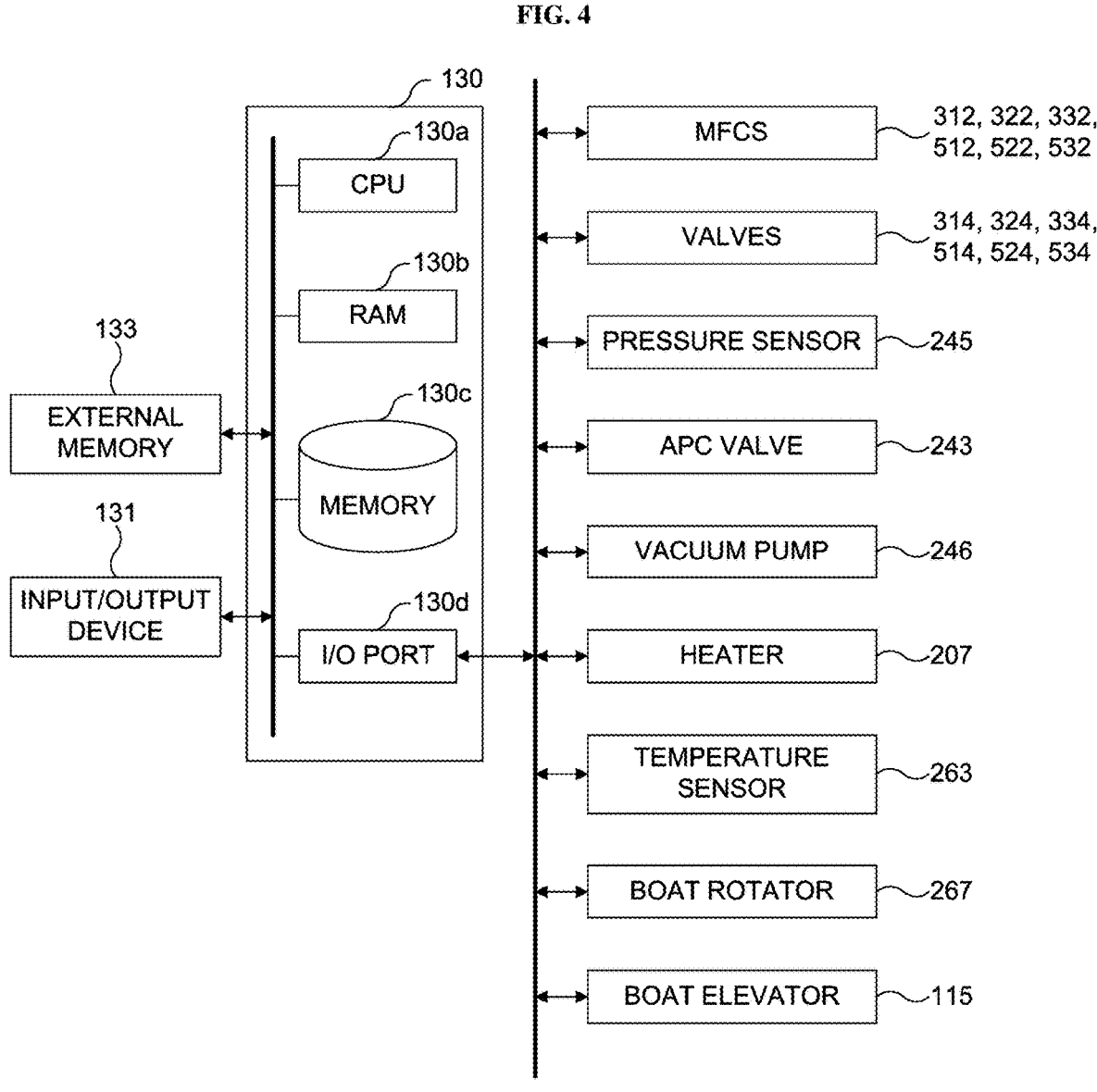
FIG. 4 is a diagram schematically illustrating an example of a configuration of a controller and related components of the substrate processing apparatus according to the embodiments of the present disclosure.

As shown in FIG. 4, a controller 130 serving as a control structure is constituted by a computer including a CPU (Central Processing Unit) 130a, a RAM (Random Access Memory) 130b, a memory 130c serving as a memory structure and an I/O port 130d. The RAM 130b, the memory 130c and the I/O port 130d may exchange data with the CPU 130a through an internal bus (not shown). For example, an input/output device 131 serving as an operation structure constituted by a component such as a touch panel is connected to the controller 130.

For example, the memory 130c is constituted by a component such as a flash memory and a hard disk drive (HDD). For example, a control program configured to control operations of the substrate processing apparatus 100 and a process recipe containing information on sequences (steps) and conditions of the substrate processing are readably stored in the memory 130c. Further, a substrate arrangement program (which is described later) according the present embodiments is readably stored in the memory 130c. The process recipe is obtained by combining the sequences (steps) of the substrate processing such that the controller 130 can execute the steps to acquire a predetermined result, and functions as a program. Hereinafter, the process recipe and the control program may be collectively or individually referred to as a "program". Further, the RAM 130b functions as a memory area (work area) where the program or data read by the CPU 130a is temporarily stored.

The I/O port 130d is connected to the above-described components such as the MFCs 312, 322, 332, 512, 522 and 532, the valves 314, 324, 334, 514, 524 and 534, the APC valve 243, the pressure sensor 245, the vacuum pump 246, the heater 207, the temperature sensor 263, the boat rotator 267, the boat elevator 115, the pod transfer device 118 and the wafer transport structure 125.

The CPU 130a is configured to read the control program from the memory 130c and execute the read control program. In addition, the CPU 130a is configured to read the process recipe from the memory 130c in accordance with an operation command inputted from the operation structure. According to the contents of the read process recipe, the CPU 130a may be configured to be capable of controlling various operations such as flow rate adjusting operations for various gases by the MFCs 312, 322, 332, 512, 522 and 532, opening and closing operations of the valves 314, 324, 334, 514, 524 and 534, an opening and closing operation of the APC valve 243, a pressure adjusting operation by the APC valve 243 based on the pressure sensor 245, a temperature adjusting operation by the heater 207 based on the temperature sensor 263, a start and stop of the vacuum pump 246, an operation of adjusting a rotation and a rotation speed of the boat 217 by the boat rotator 267 and an elevating and lowering operation of the boat 217 by the boat elevator 115.

The controller 130 is not limited to a case embodied by a dedicated computer, and may be embodied by a general-purpose computer. For example, the controller 130 according to the present embodiments may be embodied by installing the program described above onto the general-purpose computer by using an external memory 133 (for example, a semiconductor memory such as a USB memory) serving as an external memory structure in which the program described above is stored.

However, a method of providing the program to the computer such as the general-purpose computer is not limited to the method of providing the program via the external memory 133. For example, the program may be directly provided to the computer by using a communication instrument such as the Internet and a dedicated line instead of the external memory 133. In addition, the memory 130c and the external memory 133 may be embodied by a non-transitory computer-readable recording medium. Hereinafter, the memory 130c and the external memory 133 may be collectively or individually referred to as a recording medium. Thus, in the present disclosure, the term "recording medium" may refer to the memory 130c alone, may refer to the external memory 133 alone, or may refer to both of the memory 130c and the external memory 133.

First, a flow for checking in advance a transport status of substrates (that is, the wafers 200) according to the present embodiments will be described with reference to FIGS. 5A and 5B. A flow chart shown in FIG. 5A indicates a flow from when the pod 110 (that is, the wafers 200) is loaded into the substrate processing apparatus 100 to when the wafers 200 are transported to the boat 217, and a flow chart shown in FIG. 5B indicates a flow for checking an arrangement of the wafers 200 to be loaded in the boat 217 before the wafers 200 are actually transferred thererto. In the present specification, the term "boat map" in the present disclosure is a general term for data, drawings and the like representing the arrangement of the wafers 200 loaded in the boat 217. The term "boat map" also refers to an image diagram of the boat 217 (for example, see FIG. 8) in which simulated images of the wafers 200 are accommodated in a simulated image of the boat 217.

Figure 5A:
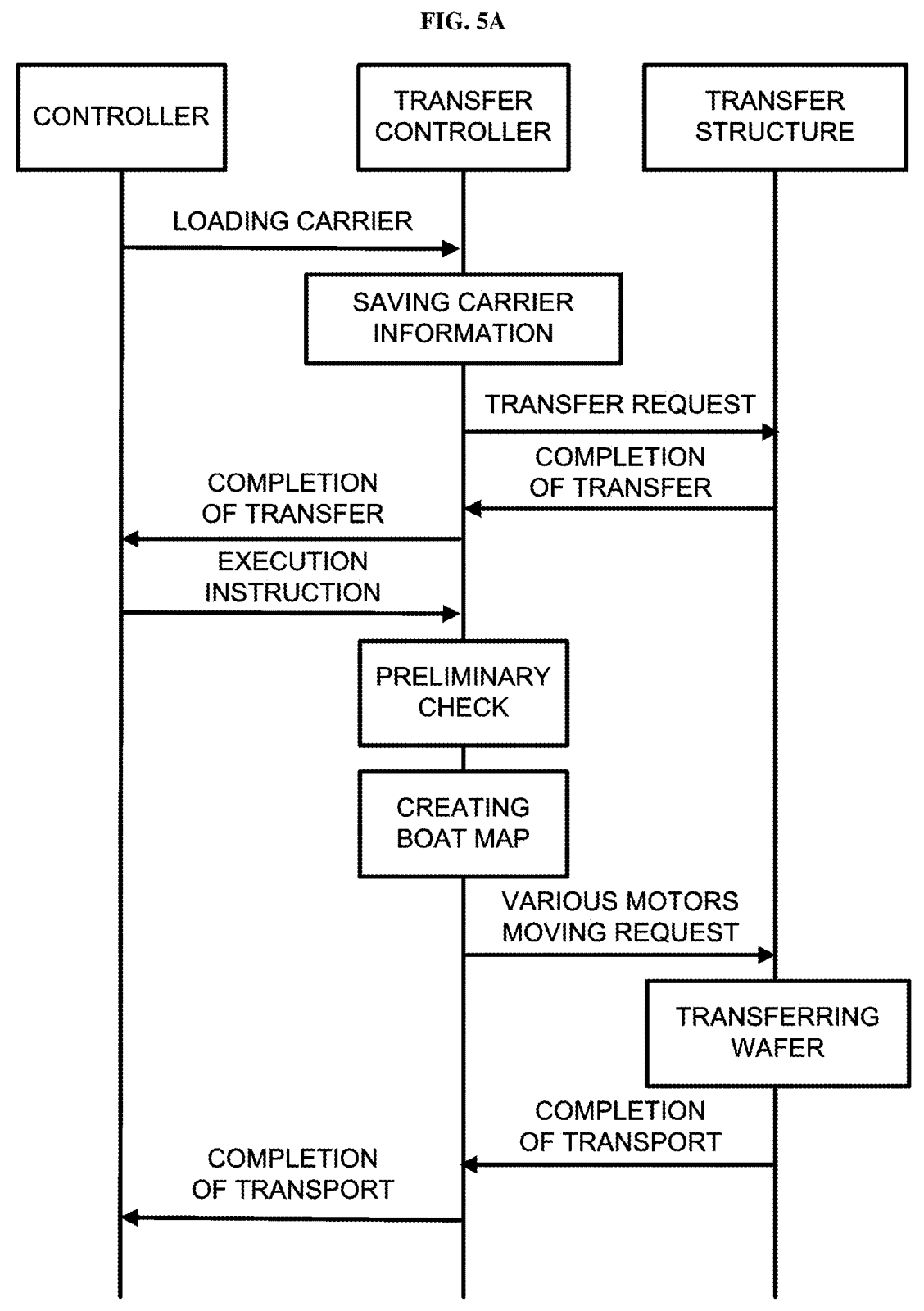

The flow chart of FIG. 5A illustrating a case of performing a conventional substrate processing will be briefly described. When receiving a notification of loading the pod 110 from the controller 130, a transfer controller (not shown in FIG. 4) saves (stores) carrier information of the pod 110. Then, the transfer controller transmits a transfer instruction (or a transfer request) to the pod transfer device 118 serving as a transfer structure. When receiving the transfer instruction, the pod transfer device 118 places the pod 110 on the storage shelf 105 and notifies the transfer controller that a transfer of the pod 110 is completed. When a number of pods 110 appropriate for the substrate processing are placed on the storage shelf 105, the transfer controller notifies the controller 130 that a transfer of the pods 110 is completed. When receiving an execution instruction from the controller 130, the transfer controller performs a preliminary check whether the wafers 200 can be transported, creates substrate arrangement data including the boat map after the preliminary check, and controls the wafer transport structure 125 serving as a transfer structure in accordance with the substrate arrangement data. When a transport of the wafers 200 to the boat 217 by the wafer transport structure 125 is completed, the transfer controller notifies the controller 130 that the transport of the wafers 200 is completed. Further, in the preliminary check, it is preferable not only to check whether the wafers 200 can be transported, but also to display a message indicating that there is a discrepancy between the number of the wafers 200 to be placed on the storage shelf 105 and the number of the wafers 200 that the boat 217 can accommodate. With such function added to the preliminary check, it is possible to detect whether the substrate arrangement data has been modified pursuant to a modification of the device before executing a simulation in a case where a device such as the semiconductor device is modified (by, for example, changing a type of the film).

According to the present embodiments, the transfer controller is configured to control the pod transfer device 118 and the wafer transport structure 125, which serve as the transfer structure. The transfer structure may further include the boat elevator 115 and the boat rotator 267. When the transport of the wafers 200 to the boat 217 is completed, the controller 130 is configured to perform the processing of the wafers 200, for example, by executing the process recipe described above.

Figure 5B:
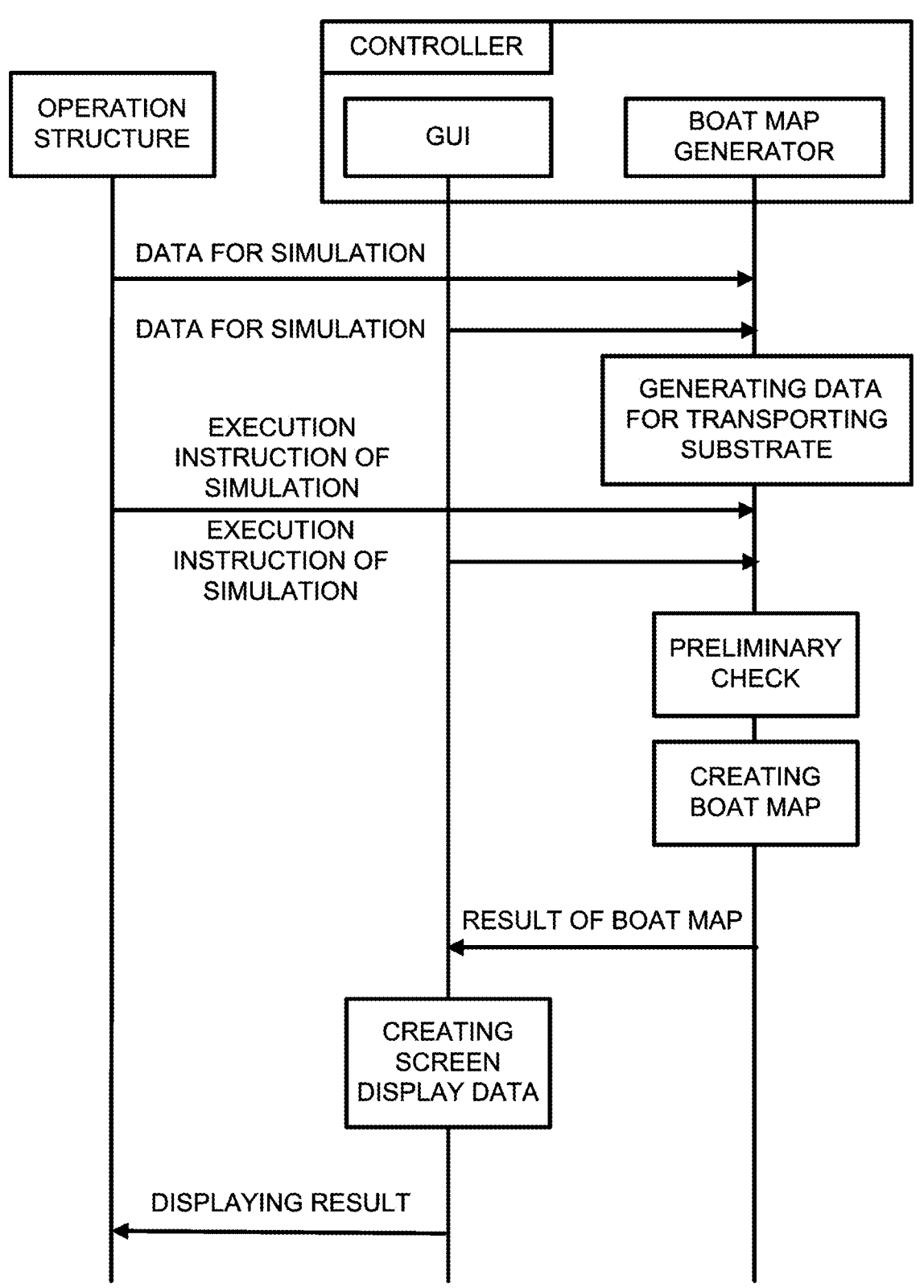
FIG. 5B is a diagram schematically illustrating a simulation of a transport flow during a substrate processing according to the embodiments of the present disclosure.

Before briefly describing the flow chart of FIG. 5B, first, the substrate arrangement program for creating the boat map based on the carrier information and the like is downloaded from the transfer controller to the controller 130 and made ready for execution. For example, when the substrate arrangement program is stored in the RAM 130b and the substrate arrangement program is activated, a boat map generator is generated in the controller 130. In the present embodiments, data resulting from the execution of the substrate arrangement program by the controller 130 may be collectively referred to as "substrate arrangement data". Therefore, data of simulation results, drawings and the like may also be included in the "substrate arrangement data". For example, in addition to the "boat map" described above, various data resulting from comparison between "boat maps" and data displayed when the simulation is performed such as the number of times of transfers, a sequential order of the transfer, transfer destination information and transfer source information may further be included in the "substrate arrangement data".

The flow chart of FIG. 5B illustrating a case of simulating the boat map will be briefly described. The boat map generator receives data related to the simulation from the input/output device 131 or an operation screen of the controller 130, and creates substrate transport data. Then, when the execution instruction is notified from the input/output device 131 or the operation screen of the controller 130, a preliminary check is performed whether the boat map (or the substrate arrangement data) can be created based on the created substrate transport data. For example, similar to the preliminary check in the flow chart of FIG. 5A, in the preliminary check in the flow chart of FIG. 5B, it is checked whether the wafers 200 can be transported.

When the preliminary check is normal (OK), the boat map generator is configured to create the boat map, and a GUI (graphic user interface) is configured to create screen display data from the result and to display the screen display data on the operation screen of the input/output device 131 or the controller 130.

First Embodiment

The flow chart shown in FIG. 5B will be described in detail with reference to FIG. 6. FIG. 6 is an example of a flow chart for checking the transport status of the wafers 200 before the wafers 200 are transported to the boat 217 according to the present embodiment. The present embodiment will be described by way of a specific example in which a discrepancy ratio is checked by comparing the boat map created in advance and the substrate arrangement data (that is, the boat map) of the wafers 200 which is input in advance by a user as desired.

A process shown in FIG. 6 includes four steps, that is, a step of registering the boat map (S1), a step of setting a parameter for executing the simulation (S2), a step of executing the simulation (S3) and a step of outputting the simulation results (S4). Each step will be described below.

S1: Selecting Transport Parameter

A transport parameter file (also referred to as a "WAP file" in the present disclosure) is selected for determining the arrangement of the wafers 200 including at least a product wafer 200A and a dummy wafer 200B to be loaded into the boat 217. A WAP (Wafer Arrangement Parameter) serving as a transport parameter may be prepared by using a logical method in which the number of the wafers 200 and a loading method thereof are set and the controller 130 automatically determines the boat map based thereon or by using a direct method in which a specific type of the wafers 200 is selectively designated for each slot of the boat 217 to be loaded. The term "slot" refers to a substrate support provided for loading the wafer 200 into the boat 217. In the present embodiment, the WAP file whose transport status is to be checked in advance is selected. In the present embodiment, the logical method in which the number of the wafers 200 and a transport method thereof are set and the controller 130 automatically determines the boat map based thereon, or the direct method in which the type of each wafer 200 to be loaded into each slot of the boat 217 is directly designated may be used as a setting method of arranging the wafers 200 in the WAP file. The transport parameter file (that is, the WAP file) refers to a file in which the transport parameter and the setting method are defined.

In the present embodiment, it is assumed that a desired boat map is created in advance by using the direct method before the present step, and the WAP file is stored in the memory 130c as a reference file. Further, the WAP file selected in the present step may be compared with the simulation results. Further, a plurality of WAP files are stored in the memory 130c of the controller 130.

Then, when the WAP file is selected and a predetermined button (which is a button for activating a transfer simulation function) is pressed, in the flow chart shown in FIG. 6, the step S2 of setting the parameter such as a transfer parameter and the carrier information for transferring the wafers 200 is performed. However, the flow described above is merely an example, and the present embodiment is not limited to the flow described above.

S2: Setting Transfer Parameter

Subsequently, as a transport-related parameter file other than the WAP file, a configuration parameter, a function parameter and a maintenance parameter are selected. By selecting the configuration parameter, a parameter relating to information on a configuration of the transfer structure and a module configuration can be set. By selecting the function parameter, a parameter relating to transfer functions such as a carrier transfer, a wafer transport and a boat transfer can be set. By selecting the maintenance parameter, a parameter relating to a transfer adjusting function such as an interlock release function can be set. Specifically, the function parameter is selected, and a screen for designating the tweezers for each of the product wafer 200A, the dummy wafer 200B and a monitor wafer 200C is displayed. Then, the screen for designating the tweezers is used to set a parameter for determining which of a five-wafer tweezers and a single-wafer tweezers is used with priority. Further, in a similar manner, the function parameter is selected and a screen for designating a shared use of the dummy wafer 200B is displayed. Then, a parameter for designating the transport of a side dummy wafer 200B1 as a supplementary dummy wafer 200B2 can be set. Hereinafter, in a case where the wafers described above are collectively referred to, the wafers may be referred to as the wafers 200. Further, in a case where the wafers described above are individually referred to based on the types of the wafers, the wafers may also be individually referred to as the "product wafer 200A", the "dummy wafer 200B", the "monitor wafer 200C", the "side dummy wafer 200B1" and the "supplementary dummy wafer 200B2", respectively, based on the types of the wafers.

S2: Setting Carrier Information

The carrier information including the types of the wafers to be stored in the pod 110, the number of the wafers to be accommodated in the pod 110 and an arrangement position of the pod 110 on the buffer shelves are set, and the pod 110 in which various wafers 200 to be loaded in the boat 217 are stored can be selected.

A simulation setting screen shown in FIG. 7 is configured such that the step S2 of setting the transfer parameter and the carrier information described above is capable of being performed on the simulation setting screen.

In a parameter setting region shown in FIG. 7, it is possible to select the configuration parameter, the function parameter and the maintenance parameter. Specifically, when a cell of a file name is selected and a "details" button is pressed, a screen in which a file list of a selected transfer parameter is illustrated is displayed, and a file can be selected on the screen described above. Further, a name of the WAP file can be checked by using the screen described above.

In a region schematically illustrating the buffer shelves (according to the present embodiment, for example, two buffer shelves including a three-stage shelf with four rows and a two-stage shelf with two rows) shown in FIG. 7, each of the pods 110 is indicated by "□" (square), and a location where the "□" (square) is not illustrated indicates that the pod 110 is not placed there. Further, in a region for selecting a material, the pods 110 to be processed are selected. Although four pods are selected in an example shown in FIG. 7, it is merely an example.

In addition, when an "edit" button provided in the region schematically illustrating the buffer shelves is pressed or when a "change" button provided in the region for selecting the material (actually the pod 110) is pressed, various setting screens are displayed. The various setting screens are configured such that detailed settings for the pods 110 and the wafers 200 can be performed on the various setting screens. The detailed settings will be described later.

S3: Executing Simulation

When a "simulation" button shown in FIG. 7 is pressed, the controller 130 creates the substrate arrangement data such as the boat map for a case where the various wafers 200 are loaded into the boat 217 based on the transport parameter selected in the step S1 and the transfer parameter and the carrier information set in the step S2. Further, the controller 130 creates the substrate arrangement data such as the boat map for a case where the various wafers 200 are loaded into the boat 217 based on the WAP file stored in advance as the reference file.

The controller 130 compares the created boat map (or the substrate arrangement data) with a target boat map (or substrate arrangement data) registered in advance in the memory 130c. In the present step, for example, the created boat map is compared with a reference file in which the desired boat map is created in advance by using the direct method in which a specific type of the wafers 200 is selectively designated for each slot of the boat 217 to be loaded. Then, the controller 130 calculates the discrepancy ratio between the created boat map and the desired boat map. Specifically, a determination is performed by comparing the created boat map (that is, the substrate arrangement data) with the desired boat map to thereby decide whether the types of wafers 200 loaded in the slots of the boat 217 in the created boat map are respectively the same as the types of wafers 200 loaded in the slots of the boat 217 in the desired boat map. The determination is performed as many times as the number of the wafers capable of being loaded into the boat 217 (that is, a total number of slots).

The controller 130 then calculates a ratio (i.e., matching ratio) of the number of the wafers 200 whose types match between the boat maps (or between the substrate arrangement data) to the number of the wafers 200 capable of being loaded into the boat 217. For example, when it is assumed that the number of the wafers capable of being loaded into the boat 217 is 100 and the number of the wafers 200 whose types do not match between the boat maps (or the substrate arrangement data) is 2, the controller 130 calculates the matching ratio to be equal to 98%. Further, when the number of the wafers 200 whose types do not match between the boat maps (or the substrate arrangement data) is large such that the calculation result clearly implies an erroneous setting and the like, an error message (not shown) may be displayed without moving on to a subsequent step. For example, when the matching ratio is less than 60%, the controller 130 determines that a parameter setting is incorrect and displays the error message. Further, the controller 130 may display an "abnormal (NG)" button alone, and may forcibly return the present screen to a selection screen (WAP screen) for selecting the WAP file. Specifically, when there is a discrepancy in the number of the wafers 200 capable of being loaded into the boat 217, it is preferable to display the message indicating a discrepancy in the number of the wafers 200. For example, after the device such as the semiconductor device is modified (for example, by changing the type of the film), it can be decided that the setting is clearly erroneous if the number of the wafers 200 set in the WAP file including the reference file stored in advance in the memory 130c is different from the number of the wafers 200 set in the substrate arrangement data created in the step S3. Thereby, it is possible to prompt the user to check whether the WAP file including the reference file stored in advance in the memory 130c is an old file before the modification, or whether the setting in the step S2 is incorrect.

S4: Displaying Simulation Results

Figure 8:
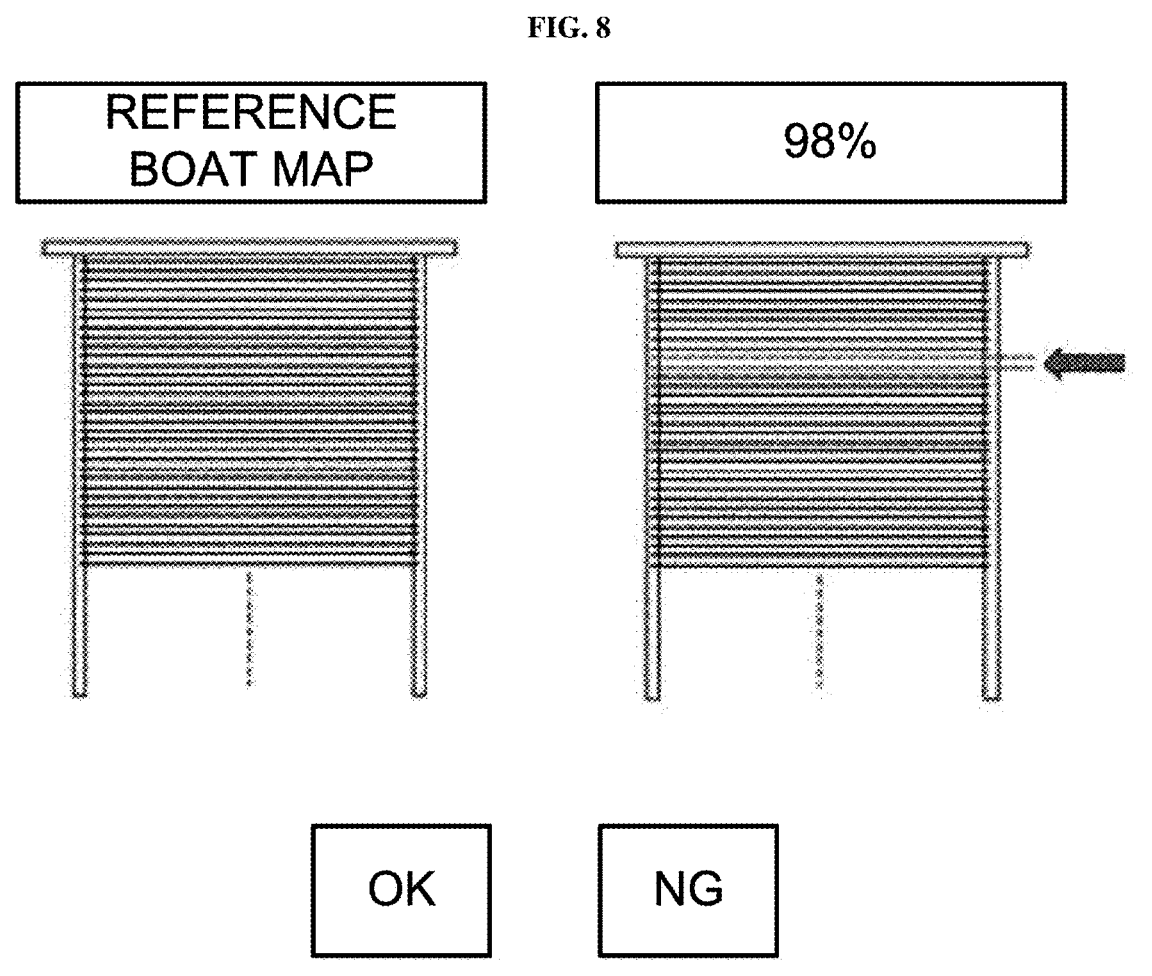

FIG. 8 is a diagram schematically illustrating an example of the simulation results. In FIG. 8, a reference boat map and the created boat map are displayed side by side. Further, the matching ratio calculated from the discrepancy ratio is displayed, for example, as 98%. Alternatively, the discrepancy ratio may be displayed, for example, as 2%. Further, the simulation results are displayed so as to indicate at least a location of a slot where the type of the loaded wafer 200 is different between in the created boat map and in the desired boat map. However, it is merely an example. Instead of displaying the entire boat map, FIG. 8 shows a part of the boat map including the slot where the type of the loaded wafer 200 is different between in the created boat map and in the desired boat map is displayed.

Further, in FIG. 8, when the "abnormal (NG)" button is pressed, the screen returns to the selection screen for selecting the WAP file. That is, the process returns to the step S1 of selecting the WAP file shown in FIG. 6. It is possible to check the contents set in the WAP file and to appropriately correct the WAP file on the selection screen. Further, when the discrepancy ratio is 0%, the created boat map is saved (or stored) by pressing an "OK" button and the process is completed. When the discrepancy ratio is 0%, it is preferable not to display the "abnormal" button on the screen. Alternatively, the "abnormal" button may be displayed as a non-pressable button.

Further, although FIG. 7 illustrates a case where the screen merely shows the name of the WAP file, the screen may be configured such that the WAP file can be reselected and the contents of the setting can be checked or changed on that screen. That is, in FIG. 8 the screen may be configured such that the process may return to the simulation setting screen when the "NG" button is pressed. In such a case, it is possible to check not only the WAP file but also other transfer parameters and the like.

According to the present embodiment, it is possible to check whether the created WAP file matches with the desired boat map before actually transferring the wafers 200. Therefore, it is possible to avoid a case in which the wafer 200 is not present in a desired slot of the boat 217 or a case in which the type of the loaded wafer 200 is different from that of the desired boat map. Thereby, it is possible to avoid a case in which the process recipe should be re-executed due to a discrepancy in the arrangement of the wafers 200 loaded in the boat 217. As a result, it is possible to contribute to an operating rate and a productivity of the device.

Second Embodiment

The flow chart shown in FIG. 5B will be described in detail with reference to FIG. 9. For example, in a case of creating the WAP file suitable for the boat map desired by the user, by using a flow shown in FIG. 9, it is possible to check whether the boat map registered by the user matches the boat map constituting the WAP file stored in advance in the memory 130c (that is, whether there is a discrepancy in the boat map). In other words, by using the simulation, it is possible to search for the WAP file of the highest matching ratio (that is, the WAP file of the smallest discrepancy ratio). In the present embodiment, similar to the example described above, when there is a discrepancy in the number of the wafers 200 capable of being loaded into the boat 217, the error message indicating the discrepancy in the number of the wafers 200 may be displayed.

Figure 9:
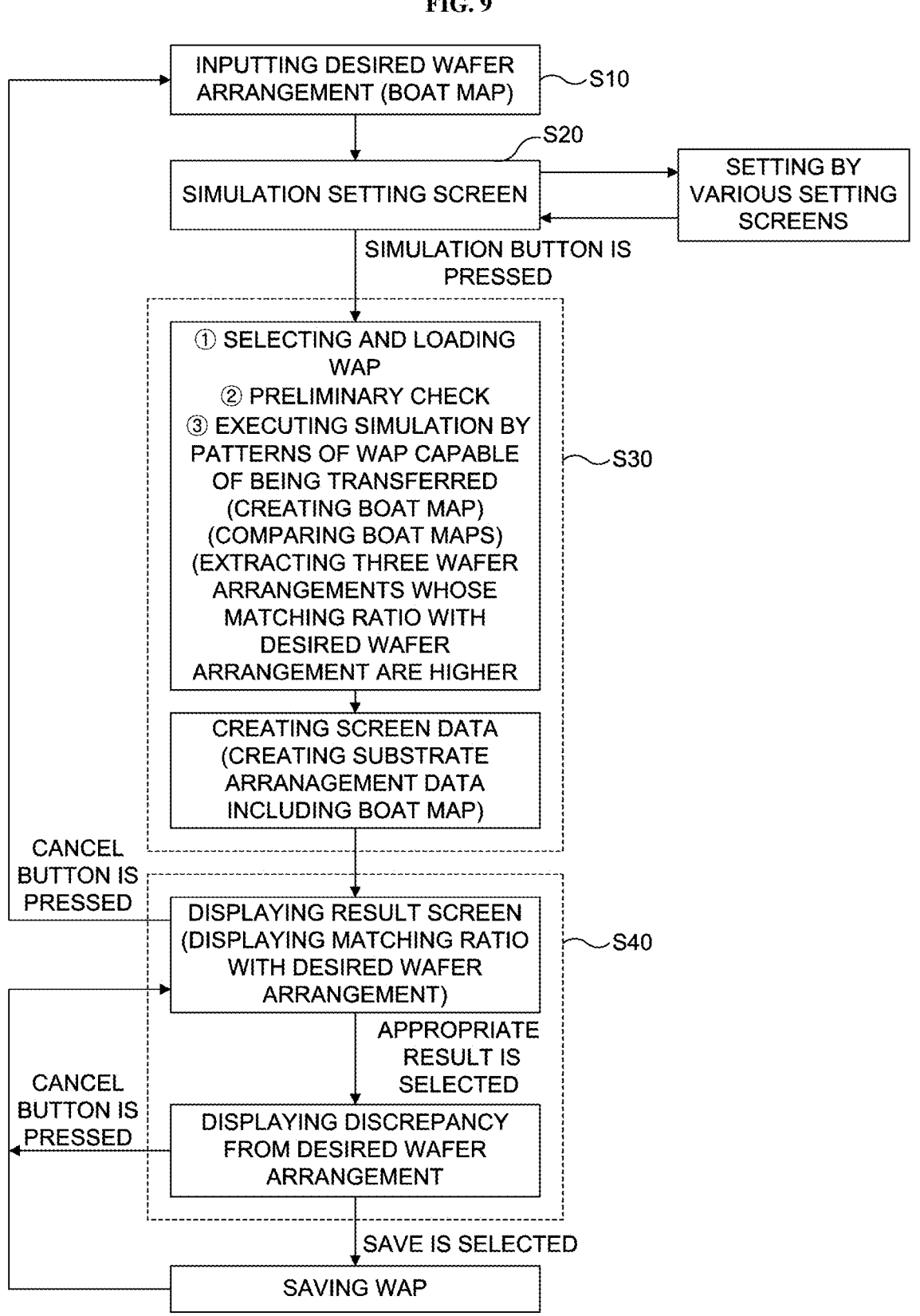
FIG. 9 is a flow chart schematically illustrating a substrate arrangement program according to a second embodiment of the present disclosure.

Similar to the process shown in FIG. 6, a process shown in FIG. 9 includes four steps, that is, a step of registering the boat map (S10), a step of setting a parameter for executing the simulation (S20), a step of executing the simulation (S30) and a step of outputting the simulation results (S40).

S10: Registering Boat Map

In the present step, the WAP file is selected, the arrangement of the various wafers 200 is set by using the direct method, and the WAP file is saved (or stored) in the memory 130c. Then, the WAP file saved in the memory 130c is selected on a WAP selection screen and the "simulation" button is pressed.

S20: Setting Parameter File

When the "simulation" button is pressed on the WAP selection screen, the simulation setting screen (see FIG. 7) is displayed. In the present step, the transfer parameter and the carrier information are set Similar to the process shown in FIG. 6, various setting screens are displayed to perform detailed settings. However, the detailed settings of the present step will be described later.

S30: Executing Simulation

When the "simulation" button shown in FIG. 7 is pressed, the controller 130 creates the substrate arrangement data such as the boat map in a case where the various wafers 200 are loaded into the boat 217 based on the boat map registered in the step S10 and the transfer parameter and the carrier information set in the step S20.

The controller 130 is configured to search for the WAP files stored in the memory 130c, to load the WAP files in the RAM 130b, to perform the preliminary check to see whether the WAP files maintain sound consistency even when the substrate arrange program is executed (whether the wafers 200 can be transferred by using the WAP files), and to create the boat map (or the substrate arrangement data) for every case where the preliminary check confirms the wafers 200 can be transferred by using the WAP files (that is, those WAP files are confirmed by the preliminary check as enabling the wafer transfer).

For the entirety of those WAP files that are confirmed by the preliminary check as enabling the wafer transfer, the controller 130 compares the created boat map (or the substrate arrangement data) with the target boat map (or the substrate arrangement data) registered in advance in the memory 130c in a manner similar to the first embodiment. Then, the controller 130 calculates the matching ratio of the number of the wafers 200 that match between the boat maps (or between the substrate arrangement data) to the number of the wafers 200 capable of being loaded into the boat 217. For example, when the number of the wafers capable of being loaded into the boat 217 is 100 and the number of the wafers 200 that fail to match between the boat maps (or between the substrate arrangement data) is 2, the matching ratio is 98%.

S40: Displaying Simulation Results

Figure 10:
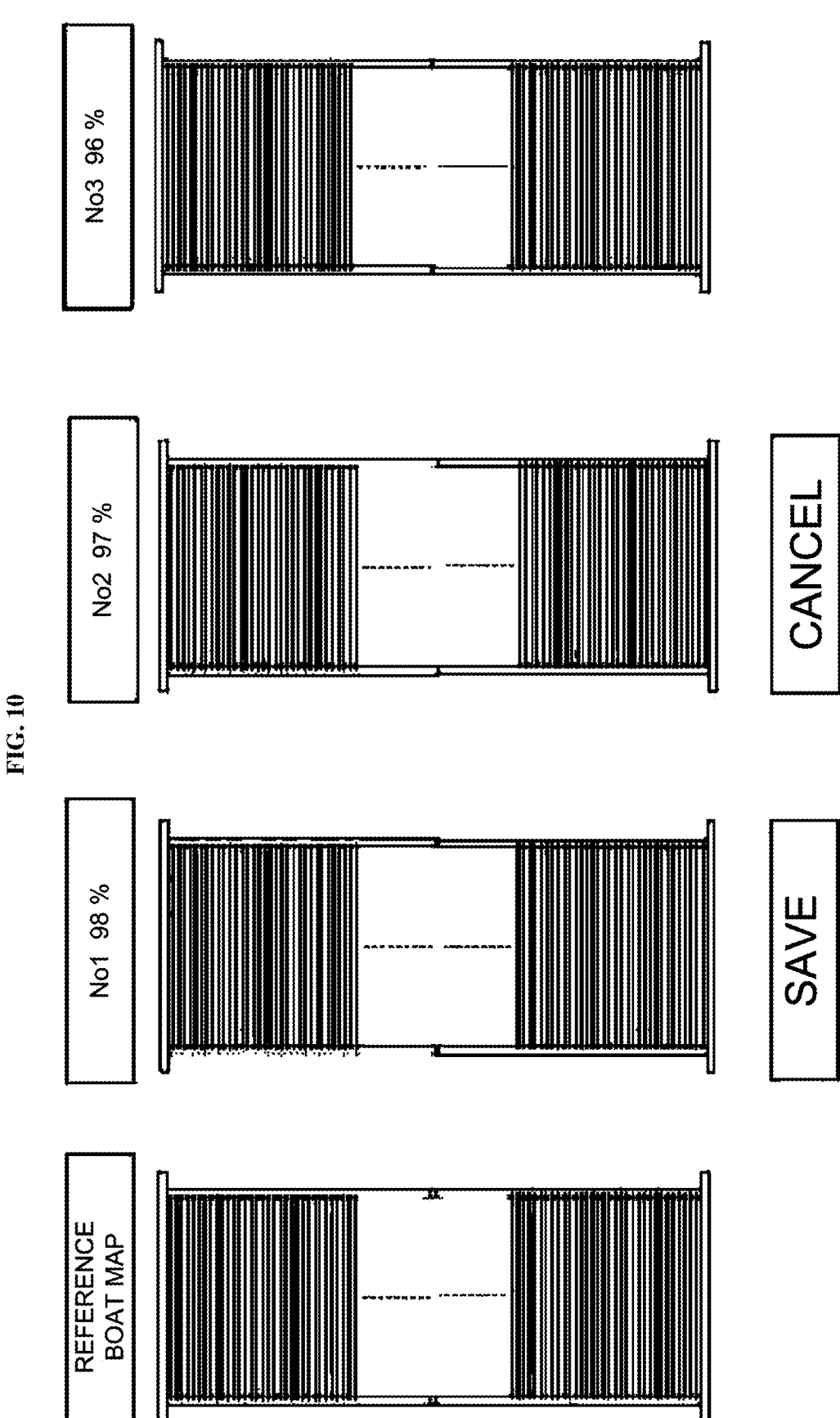
FIG. 10 is a diagram schematically illustrating an example of simulation results according to the second embodiment of the present disclosure.

The controller 130 is configured such that, based on the result of the comparison between the created boat map and the target boat map, the boat map whose matching ratio is higher is displayed with higher priority. For example, as shown in FIG. 10, the controller 130 may be configured to arrange and display the boat maps (in the present embodiment, three boat maps whose matching ratios are highest) in the order of decreasing matching ratio with respect to the reference boat map. Further, when the number of the boat maps with the matching ratio of 100% is one, the controller 130 is configured to display that boat map with the matching ratio of 100% alone.

Further, the controller 130 is configured to display the details of discrepancies between the created boat map and the reference boat map when an image of each of the boat maps displayed in FIG. 10 is selected. For example, a portion of the boat map where there is a discrepancy between the boat map created by using the transport parameter and the registered data indicating the arrangement of the substrates (that is, the wafers 200) may be displayed with priority. In addition, a portion of the boat map where there is a discrepancy in the types of the substrates between the created boat map and the reference boat map may be displayed with priority. When a "save" button is pressed on the screen, the WAP file corresponding to the selected image of the boat map is saved as the WAP file for creating the target boat map, and the screen returns to a result output screen shown in FIG. 10. When a "cancel" button is pressed, the screen simply returns to the result output screen shown in FIG. 10.

Moreover, the boat maps may be displayed in different colors based on the matching ratio. For example, when the matching ratio of the boat map is 100%, the boat map may be displayed without color. In addition, when the matching ratio of the boat map is 95% or more and less than 100%, the boat map may be displayed in blue, when the matching ratio of the boat map is 80% or more and less than 95%, the boat map may be displayed in yellow, and when the matching ratio of the boat map is less than 80%, the boat map may be displayed in red. Furthermore, in addition to the matching ratio, the wafers 200 that fail to match that of the reference boat map may be displayed in different colors. In addition, when the matching ratio of the boat map is low, for example, less than 60%, the error message and the "abnormal (NG)" button may be displayed instead of the screen shown in FIG. 10, and the screen may be forcibly return to the screen for selecting the parameter.

In addition, although the matching ratio is not 100% on a selection screen showing the image of each of the boat maps (which is a screen for checking a discrepancy between the created boat map and the reference boat map in detail) displayed in FIG. 10, the matching ratio may be considered normal (OK) as long as that does not affect the processing of the wafers 200. For example, in a case where the discrepancy exists between the side dummy wafer 200B1 and the supplementary dummy wafer 200B2, which will be described later, it is possible either to adjust the matching ratio to 100% by editing the data or to use the original matching ratio as it is.

According to the present embodiment, when the "cancel" button is further pressed in FIG. 10, the screen returns to the WAP selection screen such that the WAP file saved as described can be selected. Further, in a case where the matching ratio is not 100%, it is possible to check and correct the contents of the setting by loading the WAP file on the selection screen. It is also possible to check the matching ratio by executing the simulation by pressing the "simulation" button.

According to the present embodiment, it is possible to search for the WAP file that can be used to create the desired boat map. Further, when the "cancel" button is pressed in FIG. 10, the simulation setting screen shown in FIG. 7 may be displayed again. In such a case, it is possible to check not only the WAP file but also other transfer parameter and the like.

Third Embodiment

Figure 11:
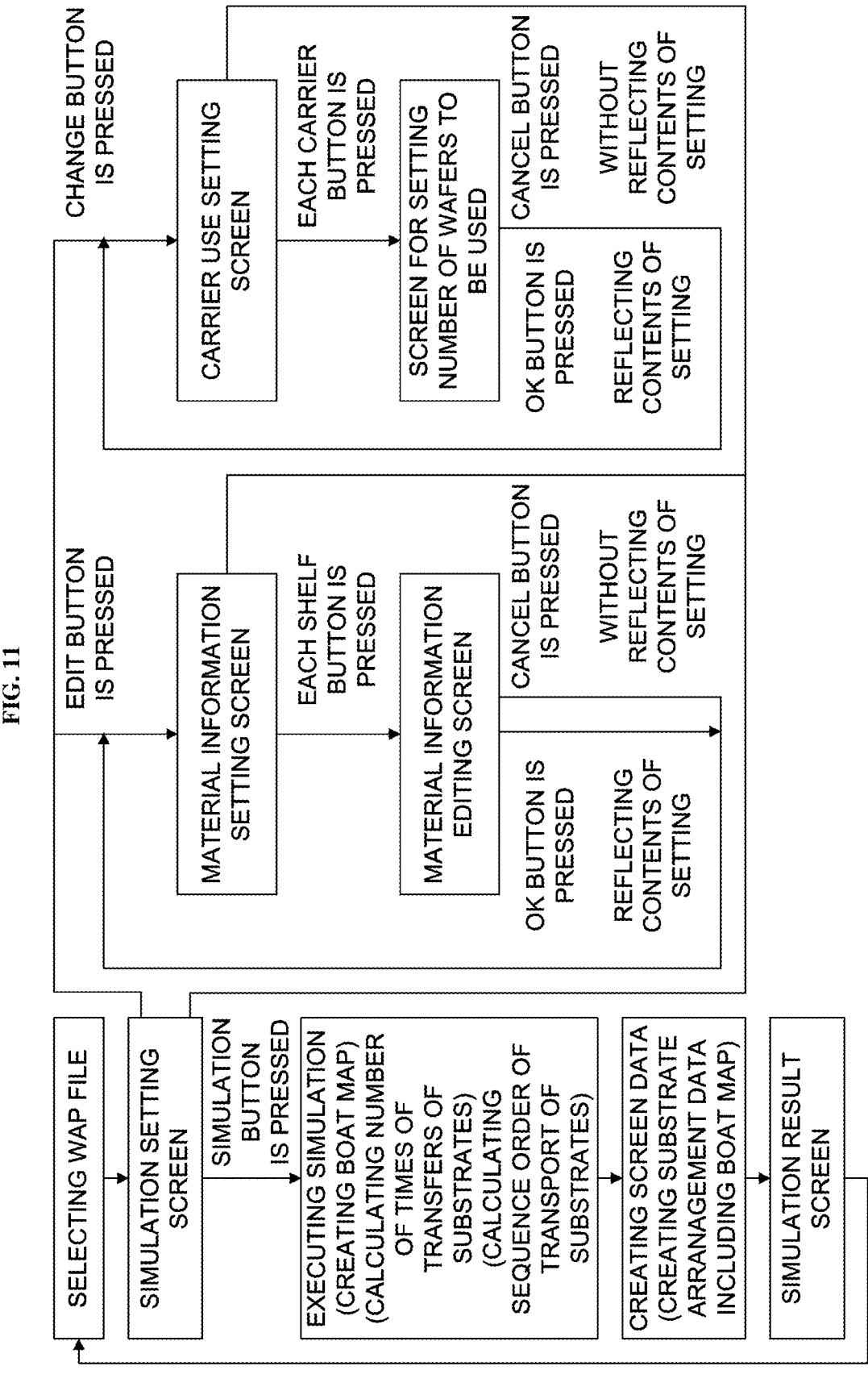
FIG. 11 is a flow chart schematically illustrating a substrate arrangement program according to a third embodiment of the present disclosure.

The flow chart shown in FIG. 5B will be described in detail with reference to FIG. 11. FIG. 11 is an example of a flow chart for checking the transport status of the wafers 200 before the wafers 200 are transported to the boat 217 according to the present embodiment. The present embodiment will be described by way of an example of checking which boat map is created based on the created WAP file.

Similar to the process shown in FIG. 6, a process shown in FIG. 11 includes four steps, that is, a step of registering the boat map (S1), a step of setting the parameter for executing the simulation (S2), a step of executing the simulation (S3) and a step of outputting the simulation results (S4). Each step of the present embodiment will be described below. In addition, features of the steps of the present embodiment substantially the same as those of the first embodiment shown in FIG. 6 may be omitted.

In the step S1 of selecting the transport parameter, similar to that shown in FIG. 6, when the transfer parameter for the transport is selected and the "simulation" button is pressed, the simulation setting screen shown in FIG. 7 is displayed.

In the step S2 of setting the parameter for executing the simulation, the setting of each transfer parameter, a setting of material information and a setting of the carrier information to be used and the like are performed. The setting of each transfer parameter is performed in the same manner as the setting of each transfer parameter shown in FIG. 7 according to the first embodiment. Hereinafter, in the present embodiment, the setting of the material information and the setting of the carrier information to be used and the like will be described. The setting of the material information is started by selecting the "edit" button shown in FIG. 7, and the setting of the carrier information to be used and the like is started by selecting the "change" button shown in FIG. 7.

First, when the "edit" button shown in FIG. 7 is selected, a material information setting screen shown in FIG. 11 is displayed. Specifically, the material information setting screen is configured such that the region schematically illustrating the buffer shelves shown in FIG. 7 (according to the present embodiment, for example, two buffer shelves including a three-stage shelf with four rows and a two-stage shelf with two rows) are displayed as an enlarged image on a separate screen. In addition, the material information setting screen is configured such that the pods 110 are arranged on each buffer shelf and the wafers 200 stored in the pods 110 are displayed in different colors according to the types thereof so that the material information setting screen can be edited. Therefore, the material information setting screen is configured such that the material information in the pod 110 can be set when the pod 110 (or shelf) arranged at the position (which is set by the transport parameter, the transfer parameter or the like described above) is selected.

In the material information setting screen, in a case where there is no need to change the arrangement of the pod 110 and the types of the wafers 200 stored in the pod 110, the screen returns to that of FIG. 7 when the "OK" button is pressed, thereby reflecting the contents of the setting of the transport parameter or the transfer parameter. Further, when the "cancel" button is pressed, the screen returns to that of FIG. 7 and the transfer parameter is selected again. Further, when the pod 110 placed on the buffer shelves is selected on the material information setting screen shown in FIG. 11, a material information editing screen indicated in FIG. 11 is displayed and the material information (which is information of the wafers 200 or wafer information) in the pod 110 selected as described above can be modified (or corrected).

For example, the material information of the pod 110 (for example, an identification number of the shelf, carrier attribute information, an identification number of the carrier, and the number of the wafers) is displayed such that each information described above can be edited. When a cell indicating the carrier attribute information is selected, a screen for selecting attribute information is displayed and an attribute of the carrier can be changed. In the present embodiment, as the attribute information, there are three types, that is, the product wafer 200A, the monitor wafer 200C and the dummy wafer 200B, and, as the types of the dummy wafer 200B, there are at least two types, that is, the side dummy wafer 200B1 and the supplementary dummy wafer 200B2. This material information editing screen is configured such that the contents of the setting are reflected when an "OK" button (not shown) thereof is pressed and the contents of the setting are not reflected when a "cancel" button thereof is pressed. In the present embodiment, the attribute of the carrier indicates the types of the wafers contained in the carrier.

As a result, it is possible to appropriately determine which shelf is to be used for accommodating a pod 110 storing a specified type of wafer. Therefore, depending on the location of the pod 110, there is a possibility that a total transfer time from a start of transferring the pod 110 to an end of transferring the wafers into the boat 217 can be shortened. Further, it is also possible to keep the shelf storing the product wafer 200A away from the shelf storing the pod 110 storing the dummy wafer 200B so as to suppress a contamination of the product wafers 200A.

Subsequently, when the "change" button shown in FIG. 7 is pressed, a carrier use setting screen shown in FIG. 11 is displayed, and the pods 110 associated with the boat map (or the substrate arrangement data) are displayed such that each pod 110 is configured to be capable of being edited. Specifically, a region for selecting the material (actually, the pod 110) shown in FIG. 7 is displayed as an enlarged image on a separate screen, and the pod 110 selected as described above and the types of the wafers stored in the pod 110 are displayed in different colors. In addition, information on the number of the wafers stored in the pod 110 is displayed so as to be capable of being edited.

Therefore, information on the wafers 200 stored in the pod 100 is configured to be set when the pod 110 (or shelf) arranged at the position (which is set by the transport parameter, the transfer parameter or the like described above) is selected. In the present embodiment, in a case where there is no need to change the number of the pods 110 selected as described above and the types or the number of the wafers 200, the screen returns to that of FIG. 7 when the "OK" button is pressed, thereby reflecting the contents of the setting of the transport parameter or the transfer parameter. Further, when the "cancel" button is pressed, the screen returns to that of FIG. 7 and the transfer parameter is selected again.

In addition, when an appropriate carrier (that is, the pod 110) is selected on the carrier use setting screen shown in FIG. 11, a screen for setting the number of the wafers to be used shown in FIG. 11 is displayed, and the wafer 200 to be used among the wafers 200 in the pod 110 can be set.

For example, the information on the wafers 200 stored in the pod 110 (which is a wafer arrangement status in the carrier) is displayed so as to be capable of being edited. By selecting a cell indicating an identification number of a wafer support in the carrier, it is possible to change the presence or absence of the wafer 200. Thereby, it is possible to appropriately change the number of the wafers 200 stored in the pod 110.

In the step S3 of executing the simulation, when the "simulation" button shown in FIG. 7 is pressed, the controller 130 creates the substrate arrangement data such as the boat map in a case where the various wafers 200 are loaded into the boat 217 based on the transport parameter (WAP file) selected in the step S10 and the transfer parameter and the carrier information set in the step S20.

When creating the boat map, the controller 130 is configured to calculate the wafer information such as the types and the number of the wafers 200 accommodated in the boat 217, the carrier information such as the number of carriers, the attribute of each carrier (that is, the types of the wafers 200 stored in the pod 110) and an identification number of the shelf (which is set in advance) on which the pod 110 is placed, and the transfer information such as an identification number of each slot representing an identification number of each substrate support provided in the boat 217, the number of times of the transfers of the wafer transport structure 125 and a sequential order of loading the wafers 200 into the boat 217 by the wafer transport structure 125. The controller 130 creates image data relating to the substrate arrangement data including the wafer information, the carrier information, the transfer information and the like, and displays the image data by using the input/output device 131 such that the substrate arrangement data is capable of being edited.

Figure 12:
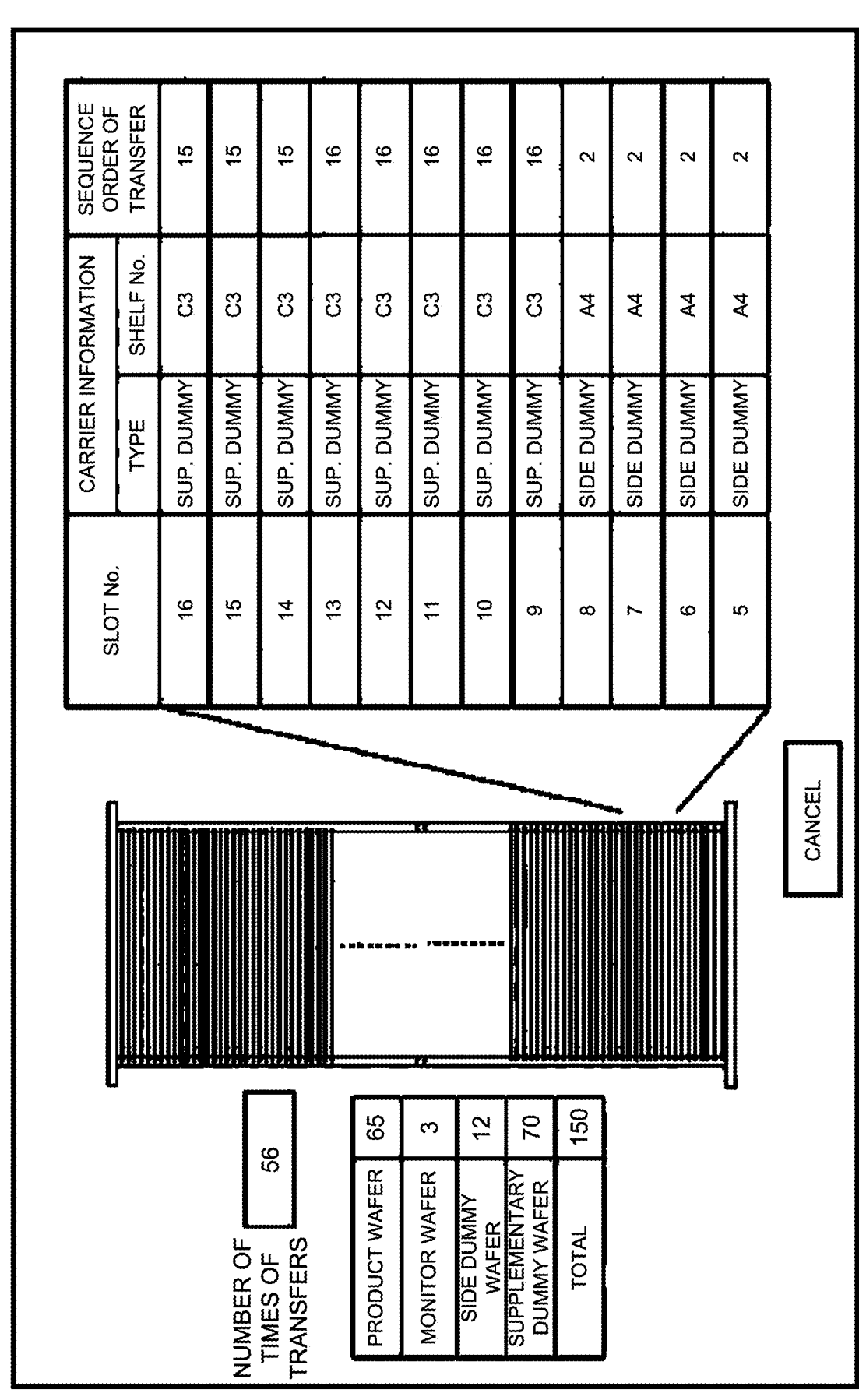
FIG. 12 is a diagram schematically illustrating an example of simulation results according to the third embodiment of the present disclosure.

In the step S4 of outputting the simulation results, the controller 130 displays, for example, an exemplary screen shown in FIG. 12 as a result of creating the substrate arrangement data such as the boat map. That is, based on the transport parameter selected in the step Si and the transfer parameter set in the step S2, the controller 130 is configured to be capable of displaying the substrate arrangement data such as the types and the number of the wafers 200 accommodated in the boat 217, the boat map, the carrier attribute ("TYPE" shown in FIG. 12), the identification number of the shelf (which is set in advance) on which the pod 110 is placed, the identification number of each slot representing the identification number of each substrate support provided in the boat 217, the number of times of the transfers of the wafers 200 by the wafer transport structure 125 and the sequential order of loading the wafers 200 into the boat 217 by the wafer transport structure 125.

Then, the exemplary screen is checked, and for example, when the number of times of the transfer is increased, the "cancel" button may be pressed to return to the screen for selecting the WAP file, and the simulation may be repeatedly performed. Then, it is possible to check the substrate arrangement data by correcting the transfer parameter and displaying the screen shown in FIG. 12 a plurality of times each time the simulation is repeatedly performed.

According to the present embodiment, it is possible to reduce the time for checking the arrangement of the wafers 200 or for checking whether or not the wafers 200 are in a predetermined sequential order of the wafer transfer. In addition, it is possible to prevent setting errors by eliminating a discrepancy in the arrangement of the wafers 200 between the user and the controller. Further, even when the number of times the wafers 200 are transported to the boat 217 may vary depending on the setting of the transfer parameter, it is possible to set an optimum transfer parameter capable of minimizing the number of times of the transfers.

Effect According to Present Embodiments

As described above, according to the present embodiments, it is possible to obtain one or more of the following effects.

(1) According to the present embodiments, it is possible to check whether the created WAP file matches the desired boat map before actually transferring the wafers 200.

(2) According to the present embodiments, it is possible to predict which boat map is to be created based on the created WAP file before actually transferring the wafers 200.

(3) According to the present embodiments, an optimum WAP file can be found by inputting a desired boat map in advance and comparing the desired boat map with the boat maps based on the WAP files stored in advance Thereby, it is possible to shorten the time for obtaining the WAP file compared with the case of creating a new WAP file, and it is possible to create the WAP file with extremely few transfer errors due to the erroneous setting.

Figure 13:
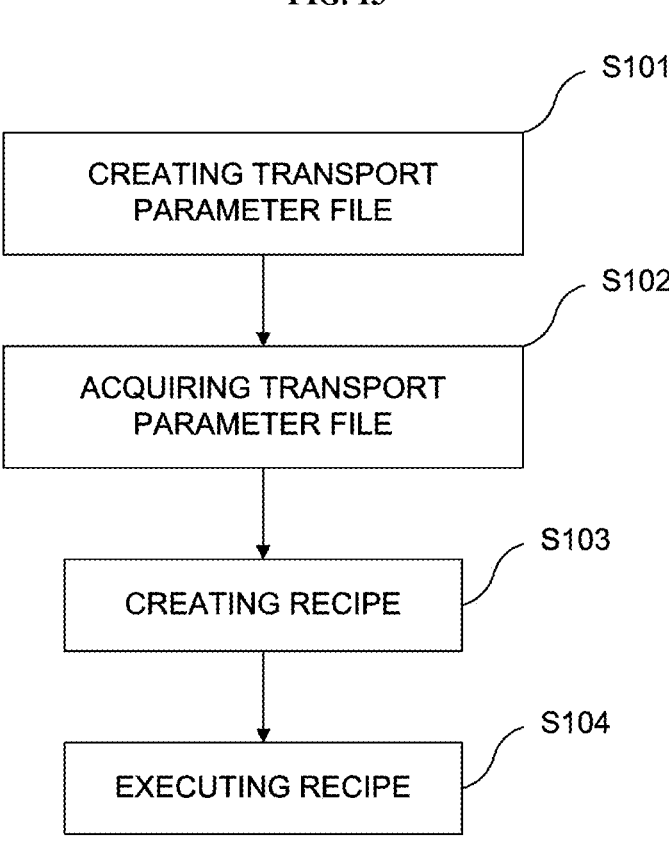
FIG. 13 is a flow chart schematically illustrating an example of the substrate processing process using the simulation results.

Subsequently, with reference to FIG. 13, a flow of creating a recipe such as the process recipe from the transport parameter file obtained from the simulation and performing the substrate processing of processing the substrates (that is, the wafers 200) by executing the recipe will be described.

A step S101 is a step of creating the WAP file used for creating the recipe. Basically, the WAP file to be saved in the memory 130c is selected. However, the WAP file created by the simulation described above shown in FIG. 5B may also be used.

A step S102 is a step of acquiring the WAP file created by the above-described simulation shown in FIG. 5B. Specifically, when a "CONTROLLER" shown in FIG. 5B is the controller 130, the WAP file obtained by the simulation is downloaded to the transfer controller, and the WAP file is read and loaded by the transfer controller. Further, when creating the recipe for processing the wafer 200 by using the WAP file stored in the memory 130c, the step S102 may be skipped and a step S103 may be performed.

In addition, the "CONTROLLER" shown in FIG. 5B may not be the controller 130, and the controller shown in FIG. 5B may be configured as a general-purpose computer. For example, a commercially available personal computer (hereinafter, abbreviated as "PC") may be used. In addition, such a PC may be arranged at a position spaced apart from the substrate processing apparatus 100 (or the transfer controller). For example, the boat map generator may be constructed inside the PC such that the substrate arrangement program can be executed.

The step S103 is a step of creating the recipe for processing the wafer 200. The recipe is created by selecting the process recipe stored in the memory 130c. The WAP file may be associated with the process recipe in advance. When the WAP file is associated with the process recipe, the WAP file is also selected by selecting the process recipe. On the other hand, when the WAP file is not associated with the process recipe in advance, the WAP file may be selected separately. Further, the process recipe and the WAP file may be associated with each other. In such a case, the WAP file is selected by selecting the process recipe and the process recipe is also selected by selecting the WAP file.

In a step S104, the controller 130 is configured to execute the substrate processing of processing the substrates by executing the recipe created in the step S103.

For example, the substrate processing step serves as a part of a manufacturing process of the semiconductor device. In the following description, the controller 130 is configured to control the processing and operations of components constituting the substrate processing apparatus 100.

In the description below, an example of forming the film on the wafer 200 by alternately supplying a first process gas (which is the first source gas) and a second process gas (which is the reactive gas) to the wafer 200 serving as the substrate will be described. A predetermined film may be formed on the wafer 200 in advance, or a predetermined pattern may be formed on the wafer 200 or on the predetermined film in advance.

Substrate Loading Step

First, in a substrate loading step, the wafers 200 are transferred (or charged) into the boat 217, and the boat 217 charged with the wafers 200 is then loaded into the process chamber 201.

Film-Forming Step

Subsequently, a film-forming step of forming the film on a surface of the wafer 200 is preformed. In the film-forming step, four steps described below (that is, first through fourth steps) are sequentially performed. Further, while performing the first through the fourth steps, the wafer 200 is heated to a predetermined temperature by the heater 207. Further, the inner pressure of the process chamber 201 is also maintained at a predetermined pressure.

First Step

In the first step, the first source gas is supplied. First, the valve 314 provided at the gas supply pipe 310 and the APC valve 243 provided at the exhaust pipe 231 are opened, and the first source gas whose flow rate is adjusted by the MFC 312 passes through the nozzle 410. Then, the first source gas is supplied into the process chamber 201 through the nozzle 410, and is exhausted through the exhaust pipe 231. When supplying the first source gas, the inner pressure of the process chamber 201 is maintained at a predetermined pressure. As a result, a silicon film is formed on the surface of the wafer 200.

Second Step

In the second step, the valve 314 provided at the gas supply pipe 310 is closed to stop a supply of the first source gas. With the APC valve 243 provided at the exhaust pipe 231 open, the process chamber 201 is exhausted by the vacuum pump 246 to remove a residual gas remaining in the process chamber 201 from the process chamber 201.

Third Step

In the third step, the reactive gas is supplied. First, the valve 334 provided at the gas supply pipe 330 and the APC valve 243 provided at the exhaust pipe 231 are opened, and the reactive gas whose flow rate is adjusted by the MFC 332 passes through the nozzle 430. Then, the reactive gas is supplied into the process chamber 201 through the nozzle 430, and is exhausted through the exhaust pipe 231. When supplying the reactive gas, the inner pressure of the process chamber 201 is maintained at a predetermined pressure. By supplying the reactive gas, a surface reaction occurs between the reactive gas and the silicon film formed on the surface of the wafer 200 by supplying the first source gas. As a result, a predetermined film is formed on the surface of the wafer 200.

Fourth Step

In the fourth step, the process chamber 201 is purged by supplying an inert gas. In the fourth step, the valve 334 provided at the gas supply pipe 330 is closed to stop a supply of the reactive gas. With the APC valve 243 provided at the exhaust pipe 231 open, the process chamber 201 is exhausted by the vacuum pump 246 to remove a residual gas remaining in the process chamber 201 from the process chamber 201.

The predetermined film is formed on the wafer 200 by repeatedly performing a cycle including the first step through the fourth step a plurality of times.

Substrate Unloading Step

Subsequently, the boat 217 accommodating the wafer 200 with the predetermined film formed thereon is unloaded out of the process chamber 201.

As described above, since the recipe is created by using the simulation of the boat map, it is possible to know which position in the boat 217 the wafer 200 is to be transported to. Further, even when the erroneous setting of a transport position of the wafer 200 occurs, it is possible to find the erroneous setting. Therefore, it is possible to suppress the erroneous setting of the transport position of the wafer 200. As a result, even when the recipe is executed, it is possible to prevent a loss of the substrates due to the erroneous setting of the wafer 200.

As described above, since the recipe is created by using the simulation of the boat map, it is possible to obtain an optimum transport parameter file, and as a result, it is possible to create the recipe with an optimum process conditions. For example, when the transport parameter file for conditions where a transport time can be minimized is selected, it is possible to expect an improvement in a throughput. Further, when the transport parameter file for conditions where the number of the transports is the smallest is selected, it is possible to lengthen a maintenance cycle of the transport device.

Further, the entire contents of Japanese Patent Application No. 2020-160829, filed on Sep. 25, 2020, are hereby incorporated in the present specification by reference. All documents, patent applications, and technical standards described in the present specification are hereby incorporated in the present specification by reference to the same extent that the contents of each of the documents, the patent applications and the technical standards are specifically described.

According to some embodiments of the present disclosure, it is possible to check the arrangement of the substrates loaded in the substrate retainer before the substrates are transported to the substrate retainer.

What is claimed is:
1. A method of displaying substrate arrangement data, comprising:

(a) setting each of a transport parameter for determining at least an arrangement of substrates to be loaded into a substrate retainer and carrier information of a carrier storing the substrates to be loaded into the substrate retainer;

(b) creating the substrate arrangement data of a case where the substrates are loaded into the substrate retainer based on the transport parameter and the carrier information set in (a);

(b-1) calculating, via a controller, a discrepancy ratio between the substrate arrangement data created in (b) and a target substrate arrangement data registered in advance by comparing the substrate arrangement data created in (b) and the target substrate arrangement data registered in advance; and (c) displaying the substrate arrangement data at least comprising data representing the arrangement of the substrates in a state where the substrates are loaded in the substrate retainer.

2. The method of claim 1, wherein types of the substrates comprise at least one of product wafers, monitor wafers, and dummy wafers.

3. The method of claim 2, wherein, in (b-1), the types of the substrates loaded in the substrate retainer are compared between the substrate arrangement data created in (b) and the target substrate arrangement data.

4. The method of claim 2, wherein, in (b-1), a ratio of the number of substrates in the substrate arrangement data whose types are different from those of the target substrate arrangement data to the number of the substrates capable of being loaded into the substrate retainer is calculated.

5. The method of claim 2, wherein, in (c), the discrepancy ratio is displayed in a manner that a portion of the substrate arrangement data where the types of the substrates are different from those of the target substrate arrangement data is displayed with priority.

6. The method of claim 1, further comprising:

(d) correcting the substrate arrangement data created in (b), wherein, in (d), contents set in the transport parameter used for creating the substrate arrangement data are corrected.

7. A method of displaying substrate arrangement data, comprising:

(a) setting each of a transport parameter for determining at least an arrangement of substrates to be loaded into a substrate retainer and carrier information of a carrier storing the substrates to be loaded into the substrate retainer;

(b) creating the substrate arrangement data of a case where the substrates are loaded into the substrate retainer based on the transport parameter and the carrier information set in (a);

(c) displaying the substrate arrangement data at least comprising data representing the arrangement of the substrates in a state where the substrates are loaded in the substrate retainer; and (e) registering the data representing the arrangement of the substrates in the state where the substrates are loaded in the substrate retainer, wherein, in (b), a matching ratio between the data representing the arrangement of the substrates registered in (e) and each substrate arrangement data created by using a plurality of transport parameters stored in advance.

8. The method of claim 7, wherein, in (c), the substrate arrangement data is displayed in descending order of their matching ratio, wherein the matching ratio is calculated by subtracting a discrepancy ratio in unit of % from 100%.

9. The method of claim 7, wherein in (c), a portion of the substrate arrangement data where a discrepancy occurs between the data representing the arrangement of the substrates registered in (e) and substrate arrangement data created by using a transport parameter selected among the plurality of transport parameters is displayed with priority.

10. The method of claim 9, further comprising:

(f) correcting the substrate arrangement data created in (b); and (g) storing the substrate arrangement data created by using the transport parameter selected among the plurality of transport parameters, wherein, in (f), contents set in the transport parameter stored in advance are corrected.

11. The method of claim 1, wherein, in (a), a transfer parameter for a transfer structure capable of transferring the substrates to the substrate retainer is further set.

12. The method of claim 11, wherein the transfer parameter comprises at least one selected from the group consisting of a parameter for information on a configuration of the transfer structure, a parameter for a transfer function comprising a substrate transport and a parameter for an adjusting function of the transfer structure during a maintenance.

13. The method of claim 2, wherein, in (b), at least one selected from the group consisting of the types and the number of the substrates accommodated in the substrate retainer, a carrier attribute determined by the types of the substrates stored in the carrier, an identification number of a substrate support provided in the substrate retainer, the number of times of transfers of the substrates by a transfer structure and a sequential order of loading the substrates into the substrate retainer by the transfer structure is calculated.

14. A method of manufacturing a semiconductor device, comprising the method of claim 1.

15. A non-transitory computer-readable recording medium storing a program that causes a substrate processing apparatus, by a computer, to perform a process comprising the method of claim 1.

16. A substrate processing apparatus comprising:

a process chamber in which substrates are processed;

a substrate retainer capable of accommodating the substrates;

a transfer structure capable of loading the substrates into the substrate retainer; and a controller configured to be capable of controlling the transfer structure, wherein the controller is further configured to be capable of performing:

(a) setting each of a transport parameter for determining at least an arrangement of the substrates to be loaded into the substrate retainer and carrier information of a carrier storing the substrates to be loaded into the substrate retainer;

(b) creating substrate arrangement data of a case where the substrates are loaded into the substrate retainer based on the transport parameter and the carrier information set in (a);

(b-1) calculating a discrepancy ratio between the substrate arrangement data created in (b) and a target substrate arrangement data registered in advance by comparing the substrate arrangement data created in (b) and the target substrate arrangement data registered in advance; and (c) displaying the substrate arrangement data at least comprising data representing the arrangement of the substrates in a state where the substrates are loaded in the substrate retainer.

* * * * *